United States Patent
Hall et al.

(10) Patent No.: US 11,685,647 B2
(45) Date of Patent: Jun. 27, 2023

(54) NANOSHEET MEMS SENSOR DEVICE AND METHOD OF MANUFACTURE

(71) Applicant: NXP B.V., Eindhoven (NL)

(72) Inventors: Mark Douglas Hall, Austin, TX (US); Tushar Praful Merchant, Austin, TX (US); Anirban Roy, Austin, TX (US)

(73) Assignee: NXP B.V., Eindhoven (NL)

( * ) Notice: Subject to any disclaimer, the term of this patent is extended or adjusted under 35 U.S.C. 154(b) by 106 days.

(21) Appl. No.: 17/188,849

(22) Filed: Mar. 1, 2021

(65) Prior Publication Data

US 2022/0274828 A1 Sep. 1, 2022

(51) Int. Cl.
B81C 1/00 (2006.01)

(52) U.S. Cl.
CPC ...... B81C 1/00031 (2013.01); B81C 1/00166 (2013.01); B81C 1/00349 (2013.01); *B81C 2201/013* (2013.01)

(58) Field of Classification Search
CPC .................................................. B81C 1/00031
See application file for complete search history.

(56) References Cited

U.S. PATENT DOCUMENTS

| | | | |
|---|---|---|---|
| 10,141,403 B1 | 11/2018 | Cheng et al. | |
| 10,269,920 B2 | 4/2019 | Cheng et al. | |
| 10,283,516 B1 | 5/2019 | Reznicek et al. | |
| 10,615,288 B1 | 4/2020 | Kong et al. | |
| 10,700,083 B1 | 6/2020 | Ramkumar et al. | |
| 2018/0248021 A1 | 8/2018 | Bi et al. | |
| 2020/0083328 A1* | 3/2020 | Li | H01L 29/0673 |
| 2020/0083382 A1 | 3/2020 | Xu et al. | |
| 2020/0168715 A1 | 5/2020 | Wu et al. | |
| 2021/0091230 A1* | 3/2021 | Wu | H01L 29/66439 |
| 2021/0166975 A1* | 6/2021 | Gardner | H01L 21/743 |

OTHER PUBLICATIONS

A. Hubert et al., A stacked SONOS technology, up to 4 levels and 6nm crystalline nanowires, with gate-all-around or independent gates (Φ-Flash), suitable for full 3D integration, IEEE, 2009.
Wikipedia, Accelerometer, downloaded from the Internet Dec. 23, 2020.
Southwest Center for Microsystems Education (SCME), Microcantilever Applications Overview, Primary Knowledge, Participant Guide, Feb. 2017.

(Continued)

*Primary Examiner* — Moazzam Hossain

(57) ABSTRACT

A nanosheet MEMS sensor device and method are described for integrating the fabrication of nanosheet transistors (61) and MEMS sensors (62) in a single nanosheet process flow by forming separate nanosheet transistor and MEMS sensor stacks (12A-16A, 12B-16B) of alternating Si and SiGe layers which are selectively processed to form gate electrodes (49A-C) which replace the silicon germanium layers in the nanosheet transistor stack, to form silicon fixed electrodes using silicon layers (13B-2, 15B-2) on a first side of the MEMS sensor stack, and to form silicon cantilever electrodes using silicon layers (13B-1, 15B-1) on a second side of the MEMS sensor stack by forming a narrow trench opening (54) in the MEMS sensor stack to expose and remove remnant silicon germanium layers on the second side in the MEMS sensor stack.

21 Claims, 14 Drawing Sheets

(56) References Cited

OTHER PUBLICATIONS

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009.
Semiconductor Engineering, Gate-All-Around FET (GAA FET), Nov. 12, 2019 https://semiengineering.com/knowledge_centers/integrated-circuit/transistors/3d/gate-all-around-fet/.
Peide Ye et al., The Nanosheet Transistor Is the Next (and Maybe Last) Step in Moore's Law, Nanosheet devices are scheduled for the 3-nanometer node as soon as 2021, IEEE Spectrum, Jul. 30, 2019.
Mark Lapedus, Semiconductor Engineering, What's After FinFETs?, Jul. 24, 2017.
Jaclyn K. Sprenger et al., Electron-enhanced atomic layer deposition of silicon thin films at room temperature, J. Vac. Sci. Technol. A, vol. 36, No. 1, Jan./Feb. 2018.

* cited by examiner

NANOSHEET MEMS SENSOR DEVICE AND METHOD OF MANUFACTURE

BACKGROUND OF THE INVENTION

Field of the Invention

The present invention is directed in general to the field of semiconductor devices. In one aspect, the present invention relates to integrated nanosheet field effect transistors (FET) devices and MEMs sensors and methods of fabricating same in a nanosheet process flow.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1×nm and 7 nm nodes, but with next-generation technologies, stacked nanosheet transistors are in line to replace finFETs as the leading edge transistor architecture starting at the 3 nm node. However, the existing solutions for fabricating nanosheet transistors are not well suited at a practical level for integrating nanosheet field effect transistor (FET) devices and other circuit elements, such as MEMs sensors, by virtue of the challenges with fabricating leading edge nanosheet transistors and MEMS sensors while meeting the performance requirements and cost constraints. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
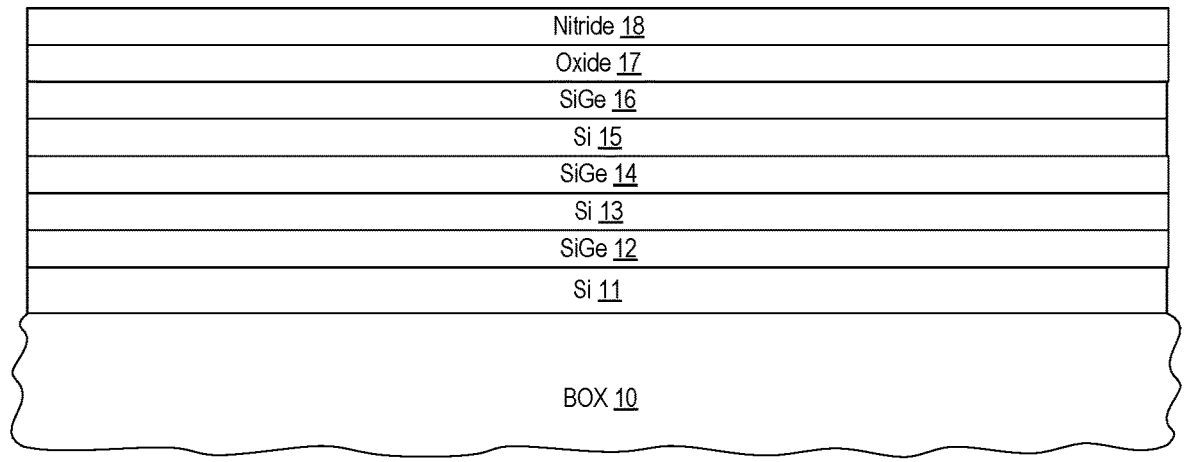
FIG. 1 is a partial cross-sectional view of a semiconductor structure including a Si/SiGe superlattice with oxide and nitride cover layers formed over a substrate in accordance with selected embodiments of the present disclosure.

A nanosheet MEMS sensor device and method are described for integrating the fabrication of nanosheet transistors and MEMS sensors in a single nanosheet process flow, thereby providing a straightforward method for integrating MEMS sensors with advanced nanosheet transistors on the same die with additional MEMS process steps that are designed to have minimal effect on the nanosheet transistors. While specific implementation details are described herein with reference to one or more example embodiments, the present disclosure is directed to fabricating MEMS sensors while the nanosheet transistors are being fabricated to make dual use of as many process steps as possible. In selected embodiments, the process steps used for fabricating the MEMS sensors are standard process steps used for fabricating the nanosheet transistors, so no new fab tools are needed. This may be obtained by patterning and etching an initial Si/SiGe superlattice substrate structure to form separate transistor and MEMS sensor stacks which are processed using nanosheet process steps to form ALD metal gates in the transistor stacks and to form silicon cantilever capacitors in the MEMS sensor stack. In selected embodiments, SiGe layers in the transistor and MEMS sensor stacks are selectively removed with a sequence of SiGe etch steps which are applied to the transistor stack and to different sides of the MEMS sensor stack. In the SiGe etch openings of the transistor stack, ALD oxide and metal layers are sequentially deposited to form transistor gate electrodes. In addition, the SiGe etch openings on a first side of the MEMS sensor stack are filled with ALD oxide layers to delineate a first stack of silicon layers forming fixed capacitive electrodes. However, the SiGe etch openings on the second side of the MEMS sensor stack delineate a second stack of silicon layers forming cantilevered capacitive electrodes. By forming a narrow trench opening in the MEMS sensor stack, the first stack of silicon layers forming fixed capacitive electrodes are spaced apart from the second stack of silicon layers forming cantilevered capacitive electrodes, thereby creating a capacitive coupling between the fixed and cantilevered electrodes that can be used for acceleration and/or vibration sensing.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-27. It is noted that, throughout this detailed description, certain layers of materials will be deposited and removed to form the semiconductor structure. Where the specific procedures for processing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

As indicated above, the existing solutions for fabricating nanosheet transistors are not well suited at a practical level for integrating the nanosheet field effect transistor (FET) devices and other circuit elements, such as MEMs sensors. For example, existing semiconductor processes for fabricating nanosheet transistors typically use a separate fabrication process and/or dedicated dies to form MEMS sensors, such as Si cantilever capacitive sensors for acceleration and vibration detection. The additional processing steps with such conventional solutions increase the cost, size, and complexity of fabricating integrated circuit devices which include nanosheet transistors. The additional processing steps for the MEMS sensors can also require new or special fabrication tools that are not required for the nanosheet transistor fabrication, further adding to the fabrication costs. In addition, the use of separate die for the nanosheet transistors and MEMS sensors can increase the overall size of the integrated circuit devices, require additional wiring and connection costs, and reduce reliability of the more complex integrated circuit devices.

Turning now to FIG. 1, a partial cross-sectional view illustrates a semiconductor structure including a Si/SiGe superlattice 11-16 which is formed over a buried oxide (BOX) or dielectric layer 10 and covered by an oxide layer 17 and nitride cover layer 18 in accordance with selected embodiments of the present disclosure. Though not shown, it will be appreciated that the semiconductor structure 10-18 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer.

As will be appreciated, any suitable sequence of processing steps may be used to form the Si/SiGe superlattice 11-16 on the base structure BOX layer 10, such as by epitaxially growing a plurality of nanosheet semiconductor layers of alternating silicon (Si) and silicon germanium (SiGe). As shown, the depicted Si/SiGe superlattice 11-16 is a stack of alternating layers which includes a first group of layers 11, 13, 15 that include silicon and a second group of layers 12, 14, 16 that include silicon germanium. While the Si/SiGe superlattice 11-16 is shown with three silicon nanosheets 11, 13, 15, it will be appreciated that the number of silicon nanosheets may be decreased or increased (e.g., 5 Si nanosheets instead of 3 Si nanosheets) to optimize transistor performance and MEMS device performance in parallel. If desired, the individual layers of the Si/SiGe superlattice 11-16 may be doped or implanted with impurities to control the conductivity of the Si/SiGe superlattice 11-16.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

After forming the Si/SiGe superlattice 11-16, a first insulator or dielectric layer 17 is formed, such as by depositing or otherwise forming a protective oxide layer 17 over the semiconductor substrate using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 20-200 Angstroms, though a thinner or thicker oxide layer may also be used. In addition, a second insulator or dielectric 18 is then formed on the protective oxide layer 17, such as by depositing or otherwise forming a protective nitride layer 18 to a predetermined thickness of approximately 20-200 Angstroms, though a thinner or thicker nitride layer may also be used. As will be appreciated, the unetched Si/SiGe superlattice 11-16 and cover layers 17, 18 are formed to cover the entire top surface of the buried oxide layer 10, including the intended nanosheet transistor and MEMS sensor areas.

Figure 2:
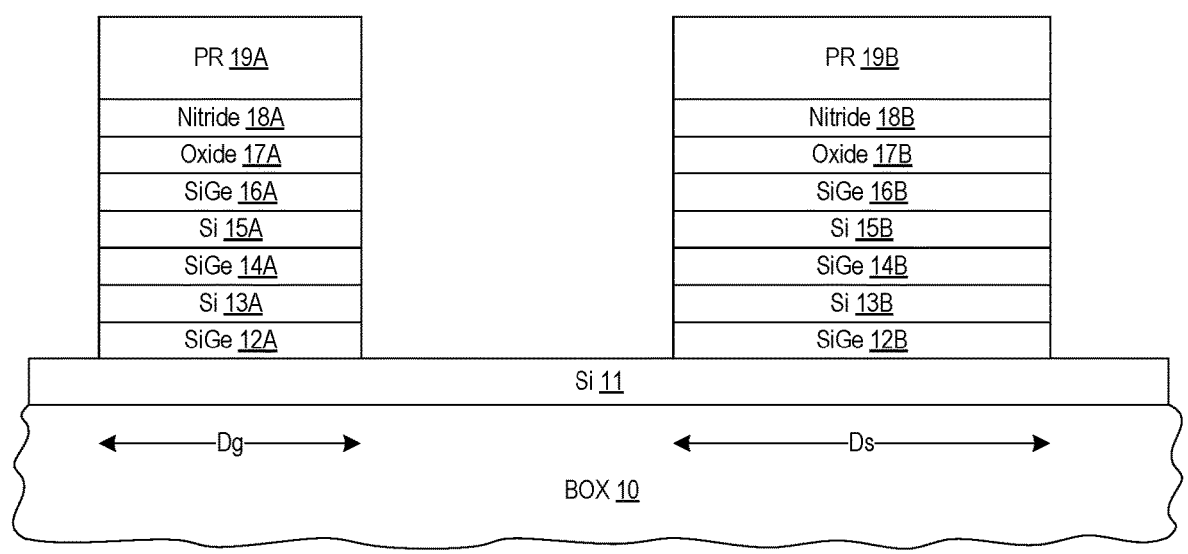
FIG. 2 illustrates processing subsequent to FIG. 1 after the Si/SiGe superlattice is patterned and etched to form a transistor stack and MEMS sensor stack.

FIG. 2 illustrates processing of the semiconductor structure subsequent to FIG. 1 after the Si/SiGe superlattice is patterned and etched to form a transistor stack and MEMS sensor stack. While any suitable pattern and etch process may be used, a first patterned mask 19A, 19B may be formed over the Si/SiGe superlattice 11-16 and over layers 17-18 by depositing, patterning, etching or developing a photoresist or hard mask layer on the nitride layer 18. With the patterned photoresist mask 19A, 19B in place, one or more etch processes are applied to create a transistor stack 12A-18A and MEMS sensor stack 12B-18B. The etch processing can include using the patterned photoresist mask 19A, 19B to perform a sequence of reactive-ion etching (RIE) steps having suitable etch chemistry properties to remove, in sequence, the exposed portions of the protective nitride layer 18, protective oxide layer 17, and underlying layers of the Si/SiGe superlattice 11-16. The resulting gate stack 12A-18A is defined by a first gate dimension Dg, and the MEMS sensor stack 12B-18B is defined by a first sensor dimension Ds. As will be appreciated, the sidewalls of the transistor stack 12A-18A and MEMS sensor stack 12B-18B are substantially vertical, though minor deviations in the sidewall profile may occur at each layer due to etch processing variations.

Figure 3:
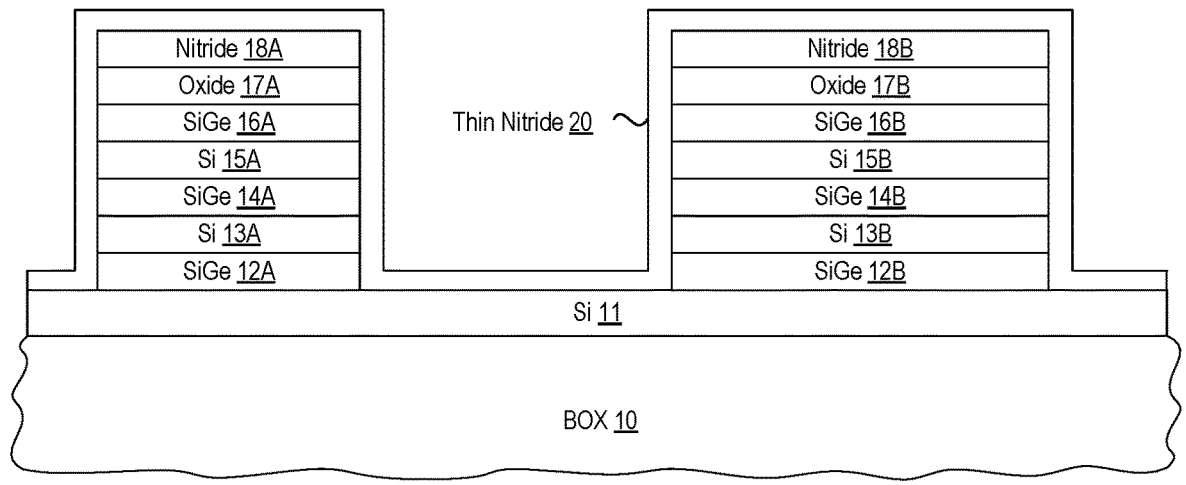
FIG. 3 illustrates processing subsequent to FIG. 2 after a first thin nitride layer is deposited over the transistor and MEMS sensor stacks.

FIG. 3 illustrates processing of the semiconductor structure subsequent to FIG. 2 after a first mask layer 20 is formed over the transistor and MEMS sensor stacks. In selected embodiments, the first mask layer 20 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The first mask layer 20 may be a different material from the underlying protective nitride layer 18 to facilitate selective etching and removal subsequently in the process. As will be appreciated, the first mask layer 20 may be formed as a substantially conformal layer of substantially uniform thickness, but this is not required in all embodiments.

Figure 4:
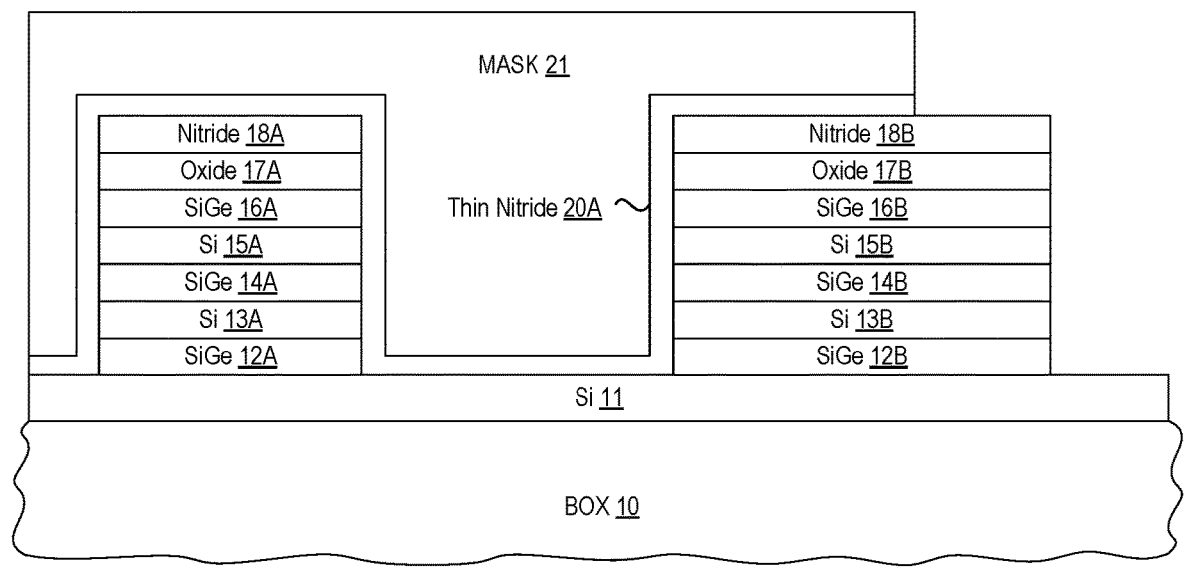
FIG. 4 illustrates processing subsequent to FIG. 3 after the first thin nitride layer is patterned and etched to form a first etch mask over the transistor stack and a first side of the MEMS sensor stack.

FIG. 4 illustrates processing of the semiconductor structure subsequent to FIG. 3 after the first thin nitride layer 20 is patterned and etched to form a first etch mask 20A over the transistor stack 12A-18A and a first interior side of the MEMS sensor stack 12B-18B. While any suitable pattern and etch process may be used, a patterned mask 21 may be formed by depositing, patterning, etching or developing a photoresist or hard mask layer on the thin nitride layer 20, and then applying an etch process (e.g., RIE) with the patterned photoresist mask 21 in place to expose the second exterior side of the MEMS sensor stack 12B-18B while leaving covered the transistor stack 12A-18A and first interior side of the MEMS sensor stack 12B-18B. As will be appreciated, the location of sidewall edge of the patterned photoresist mask 21 and patterned first thin nitride layer 20A in relation to the MEMS sensor stack 12B-18B is controlled to be positioned anywhere on top of the MEMS sensor stack 12B-18B to allow exposure of only the exposed second exterior side of the MEMS sensor stack 12B-18B.

Figure 5:
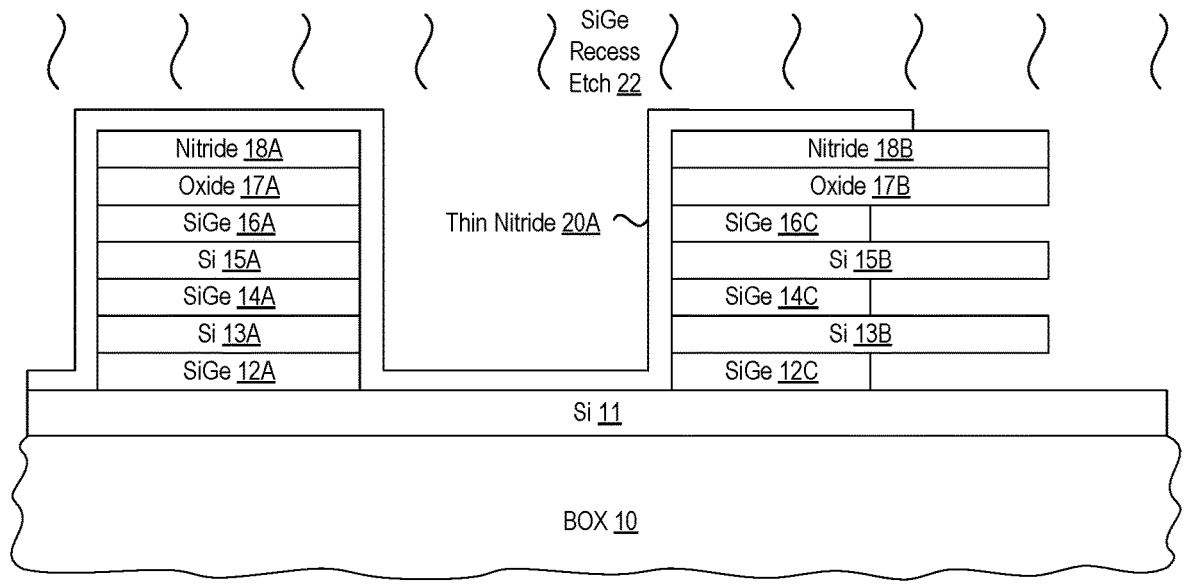
FIG. 5 illustrates processing subsequent to FIG. 4 after selectively recessing exposed SiGe layers to form recess openings on the exposed second side of the MEMS sensor stack.

FIG. 5 illustrates processing of the semiconductor structure subsequent to FIG. 4 after selectively recessing exposed SiGe layers to form recess openings on the exposed side of the MEMS sensor stack. At the depicted processing stage, the patterned mask 21 has been removed using any suitable stripping process and a selective SiGe recess etch 22 is applied to selectively and isotropically recess the SiGe layers on the exposed second exterior side of the MEMS sensor stack 12B-18B. While any suitable SiGe etch process may be used, a controlled SiGe recess etch process 22, such as a timed isotropic dry etch, may be used to remove a portion of each SiGe layer from the exposed second exterior side of the MEMS sensor stack 12B-18B. At the conclusion of the etching process, the remnant SiGe portions 12C, 14C, 16C of the MEMS sensor stack remain where the recess openings have not been formed. As will be appreciated, the etched sidewall edges of the remnant SiGe portions 12C, 14C, 16C may have a substantially vertical or slightly curved profile resulting from the selective SiGe recess etch 22. In embodiments where the selective SiGe recess etch 22 etches the SiGe layers 12B, 14B, 16B from the exposed side of the MEMS sensor stack, the positioning of sidewall edge of the patterned photoresist mask 21 and patterned nitride 20A will be controlled to place the sidewall of the remnant SiGe portions 12C, 14C, 16C in the desired final position.

Figure 6:
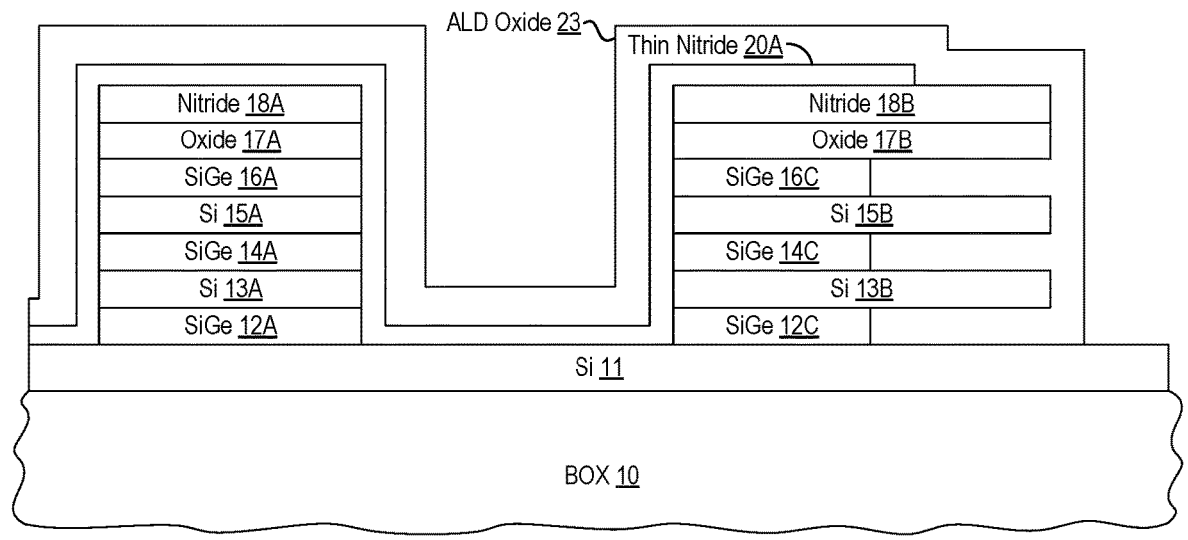
FIG. 6 illustrates processing subsequent to FIG. 5 after an atomic layer deposition (ALD) oxide layer is formed over the transistor and MEMS sensor stacks to fill recess openings on the exposed second side of the MEMS sensor stack.

FIG. 6 illustrates processing of the semiconductor structure subsequent to FIG. 5 after a conformal dielectric layer 23 is formed over the transistor and MEMS sensor stacks to fill recess openings on the exposed side of the MEMS sensor stack. In selected embodiments, the conformal dielectric layer 23 is formed with an atomic layer deposition (ALD) to conformally deposit an ALD oxide layer 23 to a thickness of approximately 5-100 Angstroms, though a thinner or thicker ALD oxide layer may also be used. However, the thickness of the ALD oxide layer 23 should be sufficient to completely fill the SiGe recess openings on the exposed side of the MEMS sensor stack. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. During these surface reactions and the layer by layer growth cycle, the ALD process exhibits some important properties for nanofabrication: excellent conformality, atomic scale thickness control, and low growth temperature. As a result, the ALD oxide deposition process offers accurate control of film thickness and composition as well as the ability to achieve excellent uniformity over large areas at relatively low temperatures. The resulting ALD oxide 23 may be formed as a substantially conformal layer to have a substantially vertical sidewall on the second exterior side of the MEMS sensor stack 12B-18B, though the profile of the ALD oxide layer 23 may follow the contour of the underlying layer(s).

Figure 7:
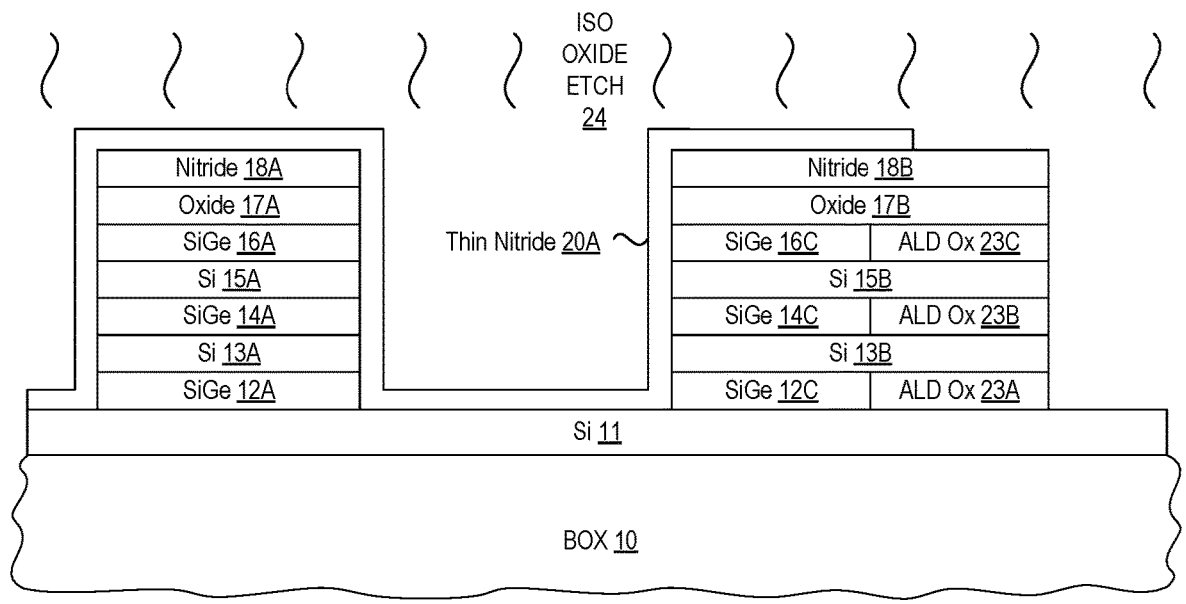
FIG. 7 illustrates processing subsequent to FIG. 6 after isotropically etching the ALD oxide layer to leave ALD oxide layers on the exposed second side of the MEMS sensor stack.

FIG. 7 illustrates processing of the semiconductor structure subsequent to FIG. 6 after etching the ALD oxide layer 23 to leave ALD oxide layers 23A-C on the second side of the MEMS sensor stack. While any suitable etch process may be used, the ALD oxide layer 23 may be etched with an isotropic oxide etch process 24 to remove the ALD oxide 23, leaving only remnant ALD oxide layers 23A-C that fill the cavities left by the SiGe recess etch at the exposed second exterior side of the MEMS sensor stack. As will be appreciated, the etched sidewall edges of the remnant ALD oxide layers 23A-C may have a substantially vertical or slightly curved profile resulting from the isotropic oxide etch 24.

Figure 8:
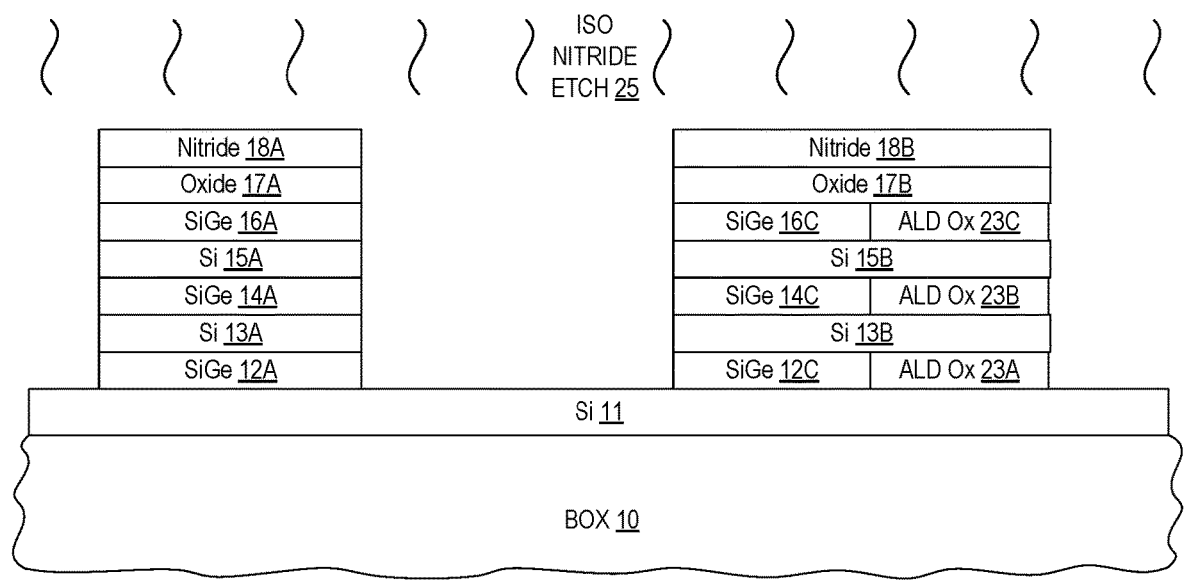
FIG. 8 illustrates processing subsequent to FIG. 7 after removing the first etch mask from the transistor and MEMS sensor stacks.

FIG. 8 illustrates processing of the semiconductor structure subsequent to FIG. 7 after removing the first etch mask 20A from the transistor and MEMS sensor stacks. While any suitable etch process may be used, the first etch mask 20A may be etched with an isotropic nitride etch process 25 to remove or strip the patterned thin nitride layer 20A, leaving the transistor and MEMS sensor stacks exposed. As will be appreciated, the nitride etch process 25 may etch partially into any exposed portion of the underlying nitride layers 18A, 18B. In addition or in the alternative, the underlying nitride layers 18A, 18B may be formed with a silicon-rich nitride which resists the nitride etch process 25.

Figure 9:
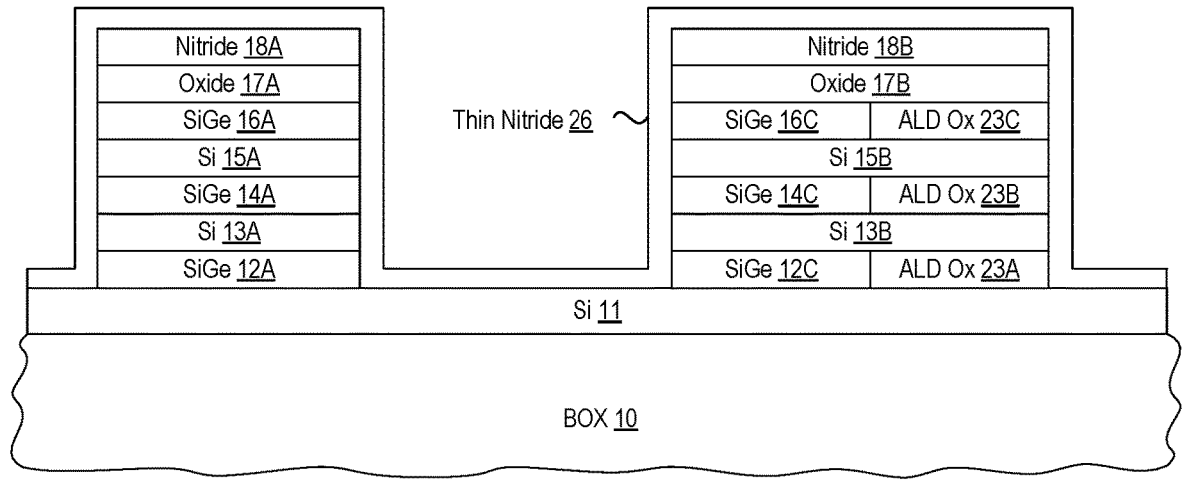
FIG. 9 illustrates processing subsequent to FIG. 8 after a second thin nitride layer is deposited over the transistor and MEMS sensor stacks.

FIG. 9 illustrates processing of the semiconductor structure subsequent to FIG. 8 after a second mask layer 26 is deposited over the transistor and MEMS sensor stacks. In selected embodiments, the second mask layer 26 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The second mask layer 26 may be a different material from the underlying protective nitride layers 18A, 18B to facilitate selective etching and removal subsequently in the process. As will be appreciated, the second mask layer 26 may be formed as a substantially conformal layer of substantially uniform thickness, but this is not required in all embodiments.

Figure 10:
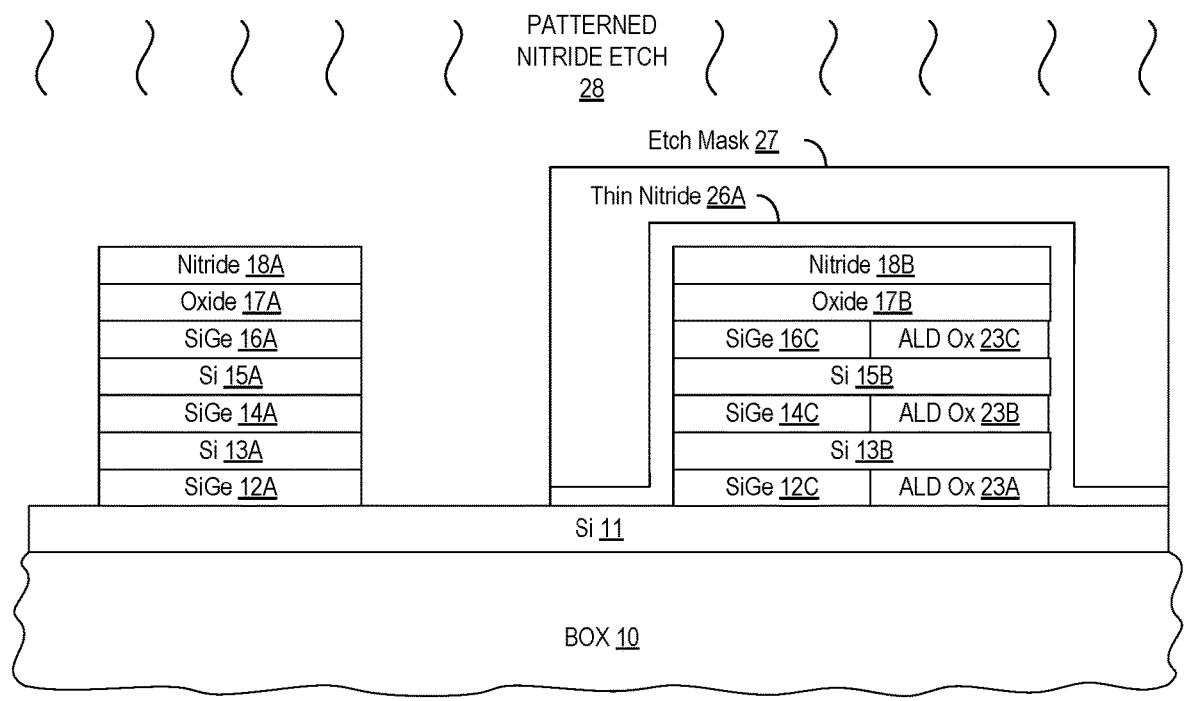
FIG. 10 illustrates processing subsequent to FIG. 9 after the second thin nitride layer is patterned and etched to form a second etch mask over the MEMS sensor stack.

FIG. 10 illustrates processing subsequent to FIG. 9 after the second thin nitride layer 26 is patterned and etched to form a second etch mask 26A to cover only the MEMS sensor stack. While any suitable pattern and etch process may be used, a patterned etch mask 27 may be formed by depositing, patterning, etching or developing a photoresist or hard mask layer on the thin nitride layer 26, and then applying a patterned nitride etch process 28 (e.g., RIE) with the patterned etch mask 27 in place to remove the thin nitride layer 26 from the transistor stack 12A-18A while leaving covered the patterned second thin nitride mask 26A in place on the top and sides of the MEMS sensor stack. As will be appreciated, the location of sidewall edge of the patterned etch mask 27 and patterned second thin nitride layer 26A in relation to the MEMS sensor stack 12B-18B is controlled to be positioned so that the top and both sides of the MEMS sensor stack are completely protected and to allow exposure of the exposed transistor stack 12A-18A.

Figure 11:
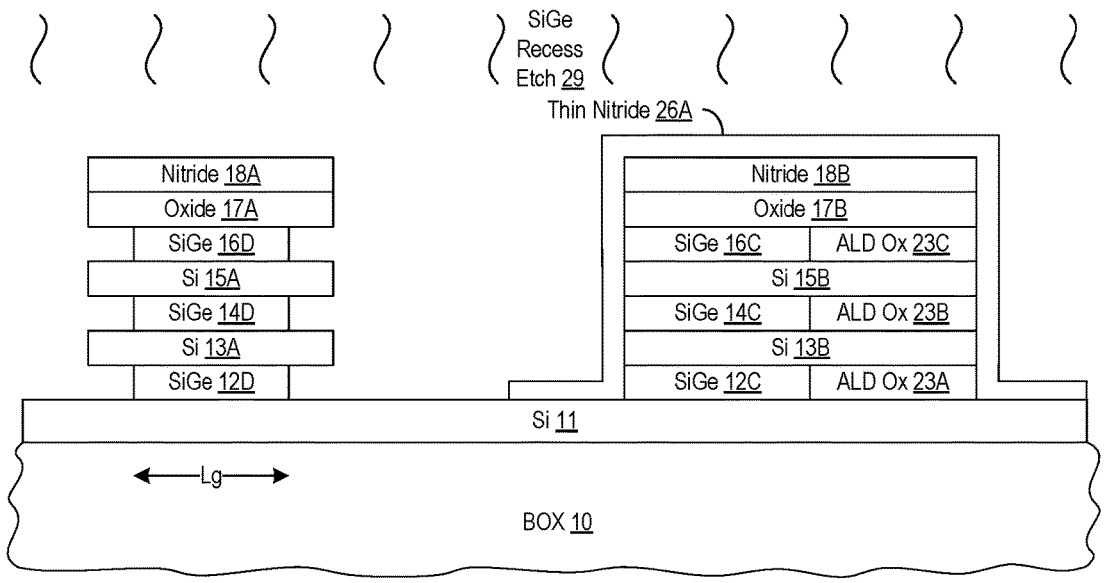
FIG. 11 illustrates processing subsequent to FIG. 10 after selectively recessing exposed SiGe layers to form recess openings on the exposed sides of the transistor stack.

FIG. 11 illustrates processing of the semiconductor structure subsequent to FIG. 10 after selectively recessing exposed SiGe layers 12A, 14A, 16A with a selective SiGe recess etch 29 to form recess openings on the exposed sides of the transistor stack 12D/13A/14D/15A/16D/17A/18A. At the depicted processing stage, the patterned etch mask 27 has been removed using any suitable stripping process, but the patterned second thin nitride mask 26A remains to block etching of the MEMS sensor stack by the selective SiGe recess etch 29 which is applied to selectively and isotropically recess the SiGe layers 12A, 14A, 16A on the exposed sides of the transistor stack 12A-18A. While any suitable SiGe etch process may be used, a controlled SiGe recess etch process 29, such as a timed isotropic dry etch, may be used to remove a portion of each SiGe layer from the exposed sides of the gate stack. At the conclusion of the etching process, the remnant SiGe portions 12D, 14D, 16D of the transistor stack remain where the recess openings have not been formed, and will define a first gate electrode length dimension Lg for the nanosheet transistors formed in the transistor stack. As will be appreciated, the etched sidewall edges of the remnant SiGe portions 12D, 14D, 16D may have a substantially vertical or slightly curved profile resulting from the selective SiGe recess etch 29.

In the gate stack 12D/13A/14D/15A/16D/17A/18A shown in FIG. 11, it is noted that both nanosheet transistors and planar FET transistors will be formed by virtue of the bottom silicon layer 11 being unetched. For example, a first nanosheet transistor will be formed with the first silicon channel region 13A under control of a gate electrode that is subsequently formed to replace the remnant SiGe portions 12D, 14D. In addition, a second nanosheet transistor will be formed with the second silicon channel region 15A under control of a gate electrode that is subsequently formed to replace the remnant SiGe portions 14D, 16D. In addition, a third planar FET transistor will be formed with the third silicon channel region 11 under control of a gate electrode that is subsequently formed to replace the remnant SiGe portion 12D. However, the third planar FET transistor could be replaced with a third nanosheet transistor by including an additional SiGe layer (not shown) below the Si/SiGe superlattice 11-16 which is processed with the same steps applied to the SiGe layers 12A, 14A, 16A described herein.

Figure 12:
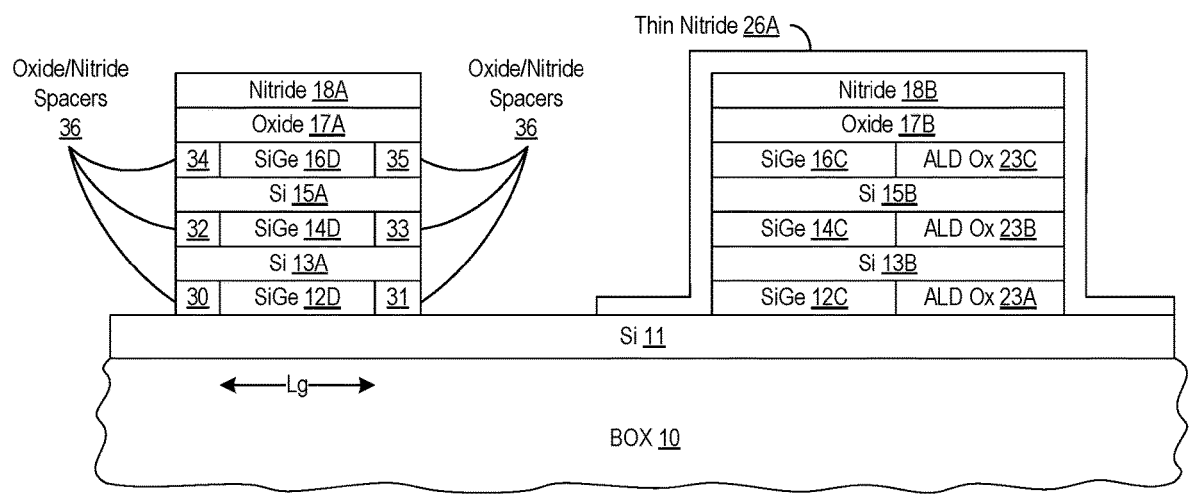
FIG. 12 illustrates processing subsequent to FIG. 11 after depositing and etching an oxide and/or nitride layer to form inner spacers to fill recess openings on the exposed sides of the transistor stack.

FIG. 12 illustrates processing of the semiconductor structure subsequent to FIG. 11 after depositing and etching an oxide and/or nitride layer to form inner spacers 36 to fill recess openings on exposed sides of the transistor stack 12D/13A/14D/15A/16D/17A/18A. While any suitable spacer formation sequence may be used, the inner spacers 36 may be formed by depositing one or more dielectric layers, such as an oxide and/or nitride layer, over the semiconductor structure (not shown) that are subsequently etched to remove the dielectric layer(s) from the top and sides of the transistor stack but leaving remnant dielectric spacers 30-35 in the recess openings at the exposed sides of the transistor stack 12D/13A/14D/15A/16D/17A/18A. For example, an inner nitride layer may be deposited over the semiconductor structure to a predetermined thickness that is sufficient to cover at least the transistor stack 12D/13A/14D/15A/16D/17A/18A and fill the recess openings on the exposed sides thereof. By applying an isotropic nitride etch process (e.g., RIE) to remove the inner nitride layer from the top and sides of the gate stack 12D/13A/14D/15A/16D/17A/18A, the remnant inner nitride layers 30-35 form sidewall spacers 36 on the transistor stack. As will be appreciated, if the inner spacers 36 are formed with nitride, it should have a different stoichiometry from the material used to form the nitride layers 18A, 26A and 18B so they are not affected or removed during the formation of the sidewall spacers 36. In addition, the protective nitride layer 18A, 18B should be thick enough to withstand the various silicon nitride etches for the whole process. As will be appreciated, the etched sidewall edges of the remnant nitride spacers 30-35 may have a substantially vertical or slightly curved profile resulting from the applied isotropic nitride etch process.

Figure 13:
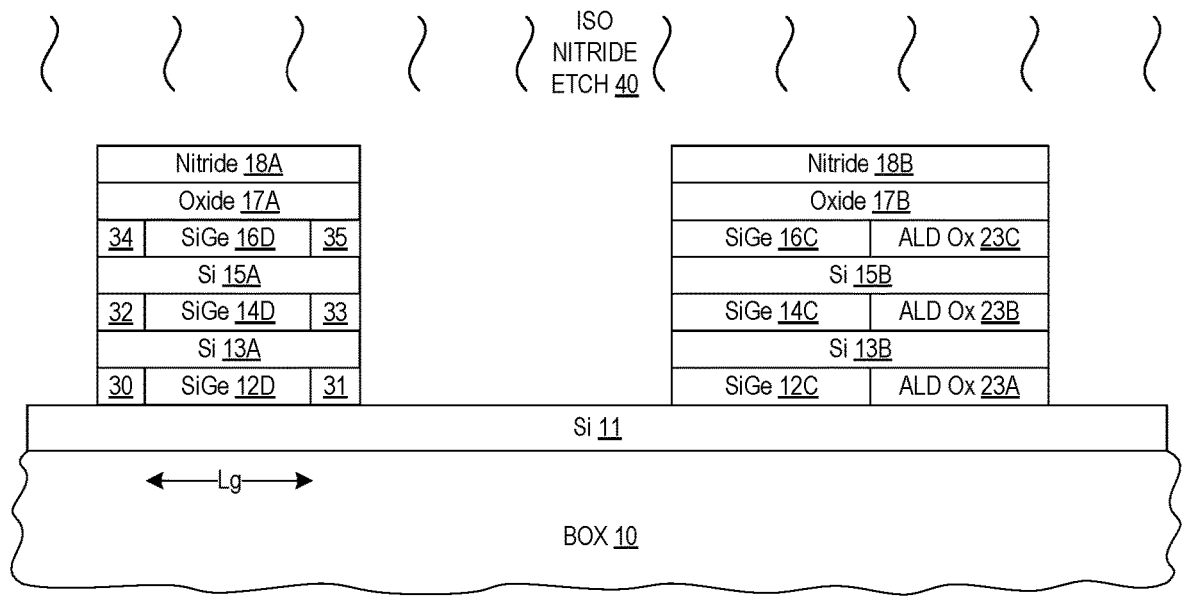
FIG. 13 illustrates processing subsequent to FIG. 12 after removing the second etch mask from the MEMS sensor stack.

FIG. 13 illustrates processing of the semiconductor structure subsequent to FIG. 12 after removing the second etch mask 26A from the MEMS sensor stack. While any suitable etch process may be used, the second etch mask 26A may be etched with an isotropic nitride etch process 40 to remove or strip the patterned thin nitride layer 26A, leaving the transistor and MEMS sensor stacks exposed. As will be appreciated, the nitride etch process 40 may etch partially into any exposed portion of the underlying nitride layer 18A and/or remnant nitride spacers 30-35. In addition or in the alternative, the underlying nitride layer 18A and/or remnant nitride spacers 30-35 may be formed with a silicon-rich nitride which resists the nitride etch process 40.

Figure 14:
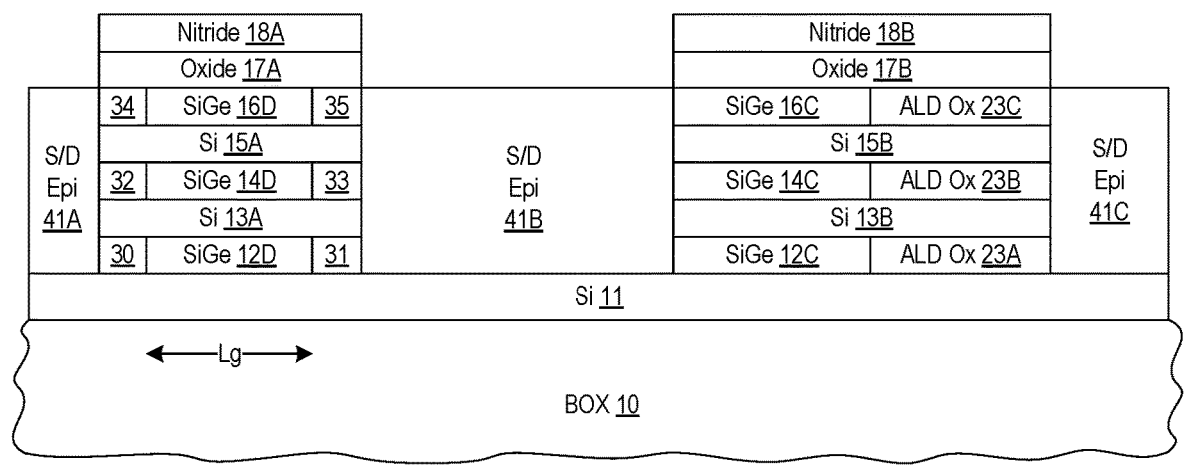
FIG. 14 illustrates processing subsequent to FIG. 13 after epitaxially growing and doping or implanting source/drain regions adjacent to the transistor and MEMS sensor stacks.

FIG. 14 illustrates processing of the semiconductor structure subsequent to FIG. 13 after source/drain regions 41A-41C are formed adjacent to the transistor and MEMS sensor stacks. While any suitable source/drain fabrication sequence may be used, the source/drain regions 41A-41C may be formed by using the silicon layer 11 to epitaxially grow or deposit a semiconductor layer (e.g., silicon) in the regions between and adjacent to the transistor and MEMS sensor stacks. As will be appreciated, the epitaxial silicon deposition or growth process forms the epitaxial source/drain regions 41A-41C from the seed semiconductor layer 11 and any exposed silicon layers 13A/B, 15A/B. At this point, the epitaxial source/drain regions 41A-41C can be doped using any suitable doping technique. For example, the epitaxial source/drain regions may be in-situ doped during the epi process, such as by doping the epitaxially grown source/drain features with boron, arsenic and/or phosphorus to form doped epitaxial source/drain regions 41A-41C. In some embodiments, the source/drain features are not in-situ doped, and instead an implantation process is performed to dope the epitaxial source/drain regions 41A-41C. As will be appreciated, the doping dose used to dope the epitaxial source/drain regions 41A-41C is greater than a doping dose (if any) used to dope the channel regions in the silicon layers 11, 13A, 15A. In addition, separate processing of the source/drain regions 41A-41C may be performed in separate processing sequences for each of N-type and P-type source/drain features. In some embodiments, after formation of the source/drain regions 41A-41C, an epi anneal process may be performed to promote formation of crystalline structures in the epitaxial source/drain regions 41A-41C, such as by applying a high thermal budget process. At a later stage in the process flow, one or more etch or polish steps may be applied to planarize the top surface of the epitaxial source/drain regions 41A-41C.

Figure 15:
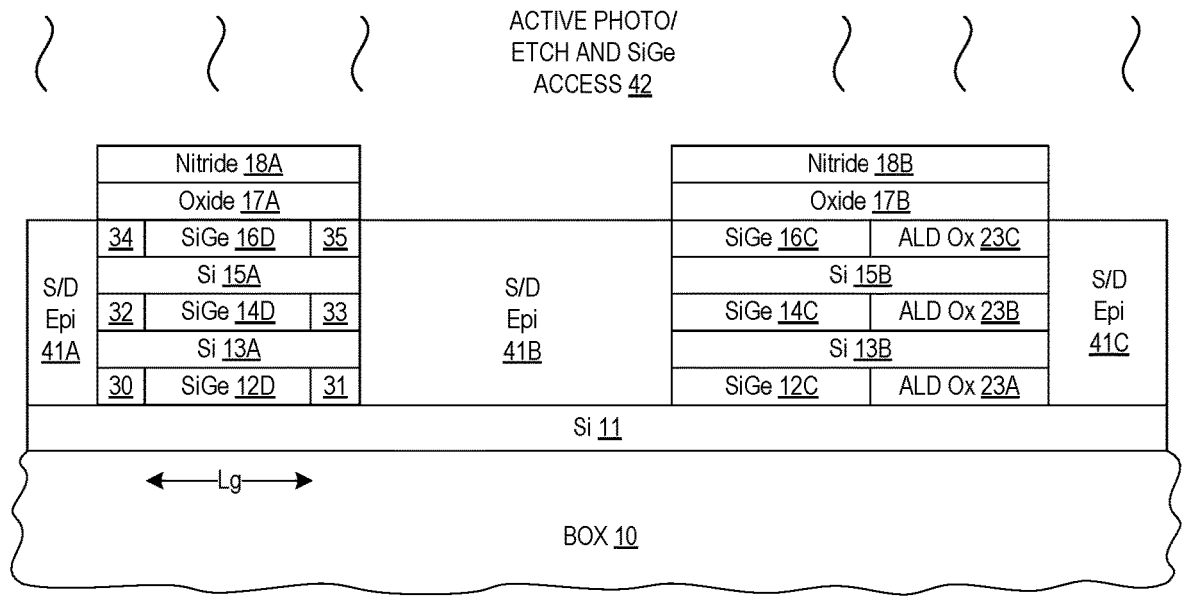
FIG. 15 illustrates processing subsequent to FIG. 14 after the transistor stack and MEMS sensor stack are patterned and etched to expose the SiGe layers in the transistor stack and the MEMS sensor stack.

FIG. 15 illustrates processing of the semiconductor structure subsequent to FIG. 14 after the gate stack and MEMS sensor stack are patterned and etched with an active photo/etch and SiGe access process 42 to expose at least the SiGe layers 12D/14D/16D in the transistor stack to a subsequent SiGe etch process. While the depicted cross-sectional drawing does not show etch openings that expose the SiGe layers 12D/14D/16D, it will be appreciated that the etch openings may be formed in the z-axis plane (in and out of the paper) to expose peripheral ends of the SiGe layers 12D/14D/16D. In addition, the epitaxial source/drain region 41B is shown as a single block that could be used as a common node (e.g., ground) between a transistor in the transistor stack region and the MEMS sensor stack, but the active photo/etch and SiGe access process 42 could be used to form an etch opening which cuts the epitaxial source/drain region 41B into separate portions of epitaxial silicon. While any suitable pattern and etch process may be used, the active photo/etch and SiGe access process 42 may include forming a patterned mask (not shown) over the semiconductor structure by depositing, patterning, etching or developing a photoresist or hard mask layer on the epitaxial source/drain regions 41A-41C and transistor and MEMS sensor stacks. With the openings formed in the patterned photoresist/hard mask, the active photo/etch and SiGe access process 42 may also include one or more etch processes that are applied to create SiGe access openings in at least the transistor stack 12D/13A/14D/15A/16D/17A/18A which expose at least the SiGe layers 12D/14D/16D. The etch processing can include performing a sequence of reactive-ion etching (RIE) steps having suitable etch chemistry properties to remove, in sequence, the exposed portions of the protective nitride layer 18A, protective oxide layer 17A, and underlying layers of the transistor stack 12D/13A/14D/15A/16D.

Figure 16:
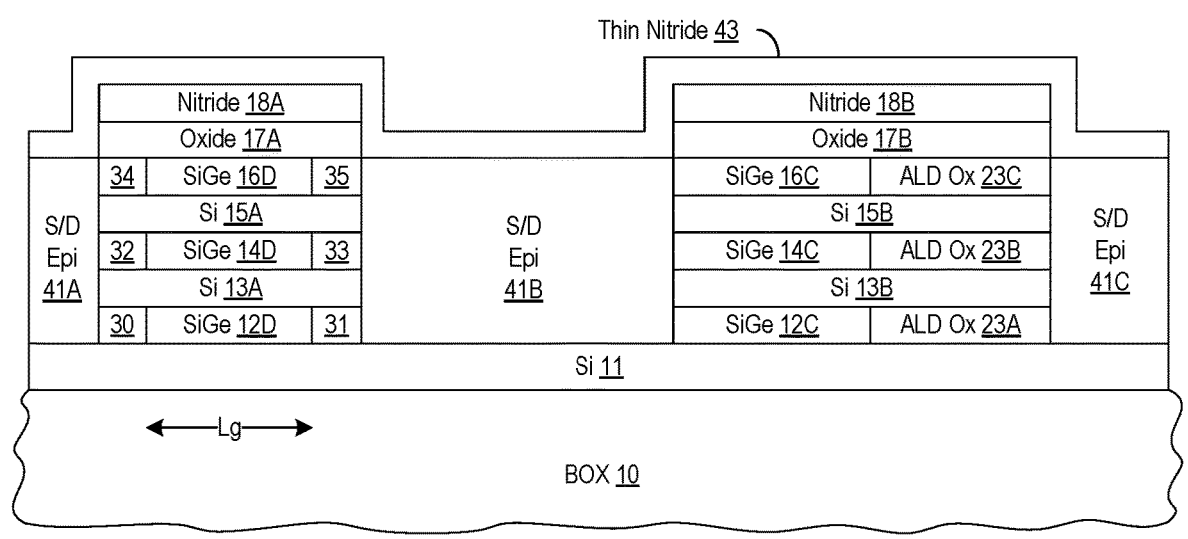
FIG. 16 illustrates processing subsequent to FIG. 15 after a third thin nitride layer is deposited over the transistor and MEMS sensor stacks.

FIG. 16 illustrates processing of the semiconductor structure subsequent to FIG. 15 after a third mask layer 43 is deposited over the gate and MEMS sensor stacks. In selected embodiments, the third mask layer 43 is formed as a thin nitride layer using any suitable deposition process, such as CVD, PECVD, PVD, ALD, or any combination(s) of the above to a thickness of approximately 20-200 Angstroms, though a thinner or thicker nitride mask layer may also be used. The third mask layer 43 may be a different material from the underlying protective nitride layers 18A, 18B to facilitate selective etching and removal subsequently in the process. As will be appreciated, the third mask layer 43 may be formed as a substantially conformal layer of substantially uniform thickness, but this is not required in all embodiments.

Figure 17:
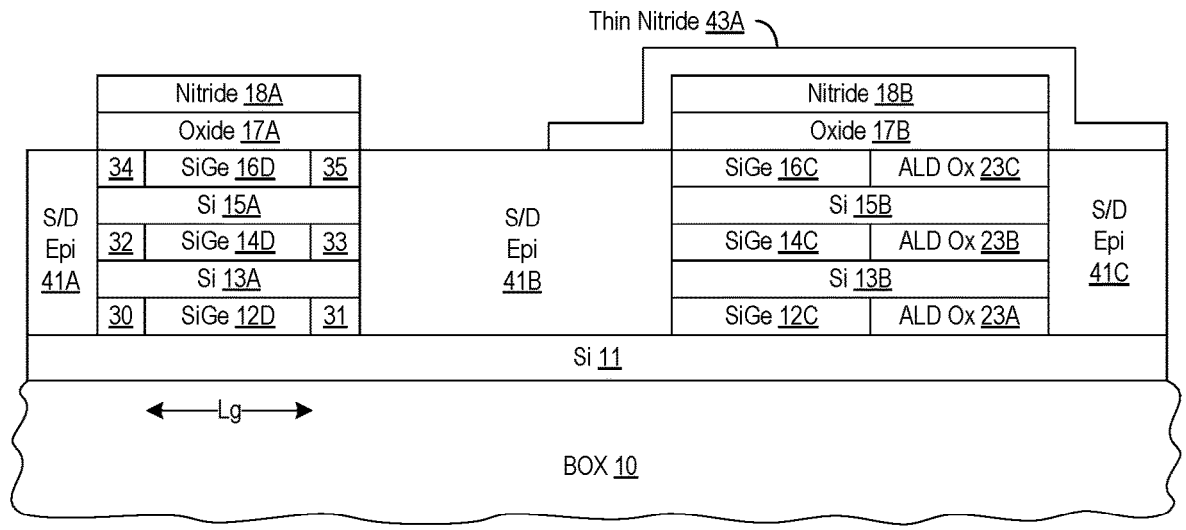
FIG. 17 illustrates processing subsequent to FIG. 16 after the third thin nitride layer is patterned and etched to form a third etch mask over the MEMS sensor stack.

FIG. 17 illustrates processing of the semiconductor structure subsequent to FIG. 16 after the third mask layer 43 is patterned and etched to form a third patterned etch mask 43A over the MEMS sensor stack. While any suitable pattern and etch process may be used, the third patterned etch mask 43A may be formed by depositing, patterning, etching or developing a photoresist or hard mask layer on the thin nitride layer 43, and then applying an isotropic nitride etch process with the patterned etch mask in place to remove the thin nitride layer 43 from the transistor stack 12D/13A/ 14D/15A/16D/17A/18A while leaving covered the patterned third thin nitride mask 43A in place on the top and sides of the MEMS sensor stack. As will be appreciated, the location of sidewall edge of the patterned third thin nitride layer 43A in relation to the MEMS sensor stack is controlled to be positioned so that the top and both sides of the MEMS sensor stack are completely protected and to allow exposure of the exposed transistor stack 12D/13A/14D/15A/16D/ 17A/18A.

Figure 18:
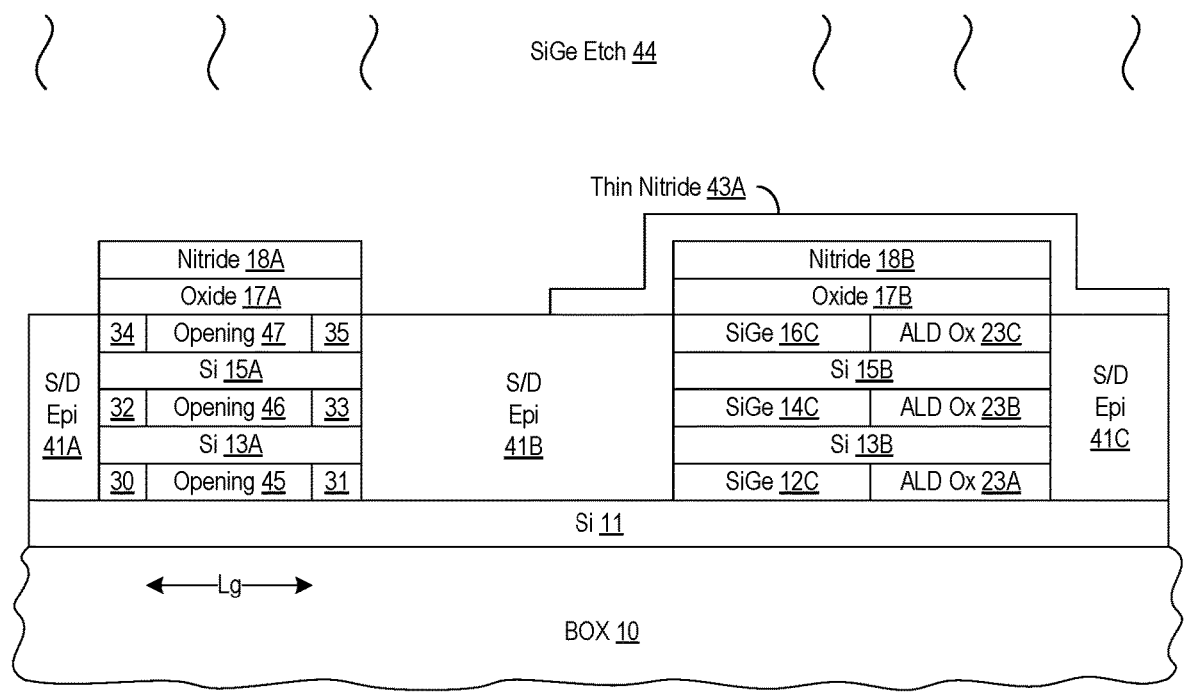
FIG. 18 illustrates processing subsequent to FIG. 17 after selectively etching exposed SiGe layers to form gate openings in the transistor stack.

FIG. 18 illustrates processing of the semiconductor structure subsequent to FIG. 17 after applying a SiGe etch process 44 to selectively etch exposed SiGe layers 12D, 14D, 16D to form gate openings 45-47 in the transistor stack. While any suitable SiGe etch process may be used, a selective isotropic SiGe etch process 44, such as a timed isotropic dry etch, may be used to remove the exposed remnant SiGe layers 12D, 14D, 16D from the transistor stack. At the conclusion of the SiGe etching process 44, the remnant SiGe portions 12D, 14D, 16D of the transistor stack are replaced by gate openings 45-47 where the gate electrodes for the nanosheet transistors will be formed in the gate stack. At the depicted processing stage, the patterned third thin nitride mask 43A remains to block etching of the MEMS sensor stack by the selective SiGe etch 44.

Figure 19:
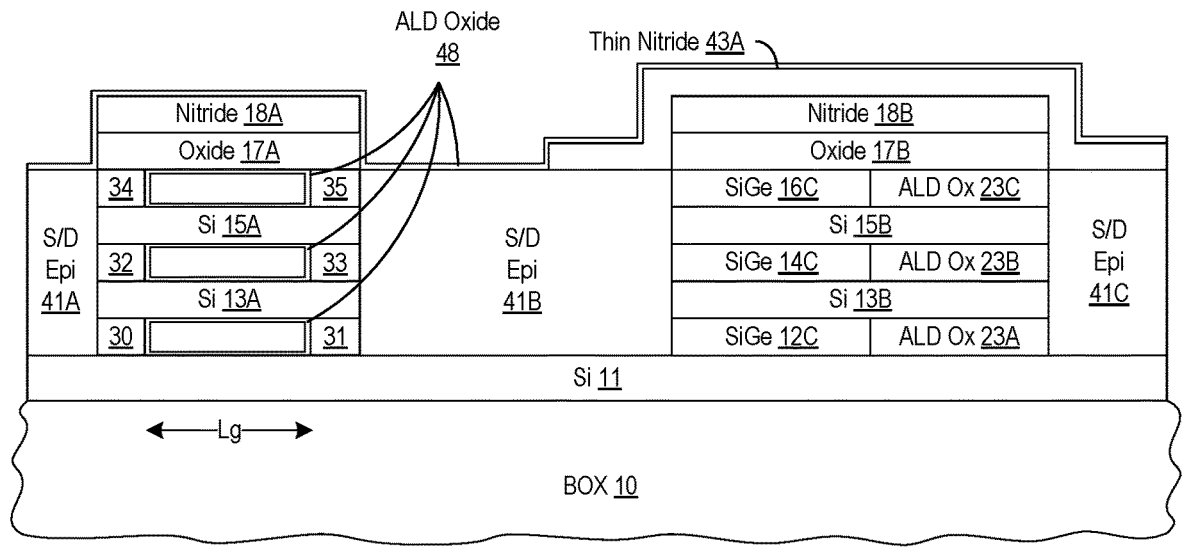
FIG. 19 illustrates processing subsequent to FIG. 18 after an atomic layer deposition (ALD) oxide layer is formed as a liner layer over the transistor and MEMS sensor stacks and in the gate openings of the transistor stack.

FIG. 19 illustrates processing of the semiconductor structure subsequent to FIG. 18 after a conformal gate dielectric layer 48 is formed as a liner layer over the transistor and MEMS sensor stacks and in the gate openings of the transistor stack. In selected embodiments, the conformal gate dielectric layer 48 is formed with an atomic layer deposition (ALD) to conformally deposit an ALD oxide layer 48 to a desired gate dielectric thickness (e.g., 5-50 Angstroms) on the interior surfaces of the gate openings 45-47 without completely filling the gate openings. In selected embodiments, the ALD oxide deposition process may by implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layers in the gate openings 45-47, the resulting ALD oxide 48 forms a substantially conformal layer over the upper surface of the semiconductor structure.

Figure 20:
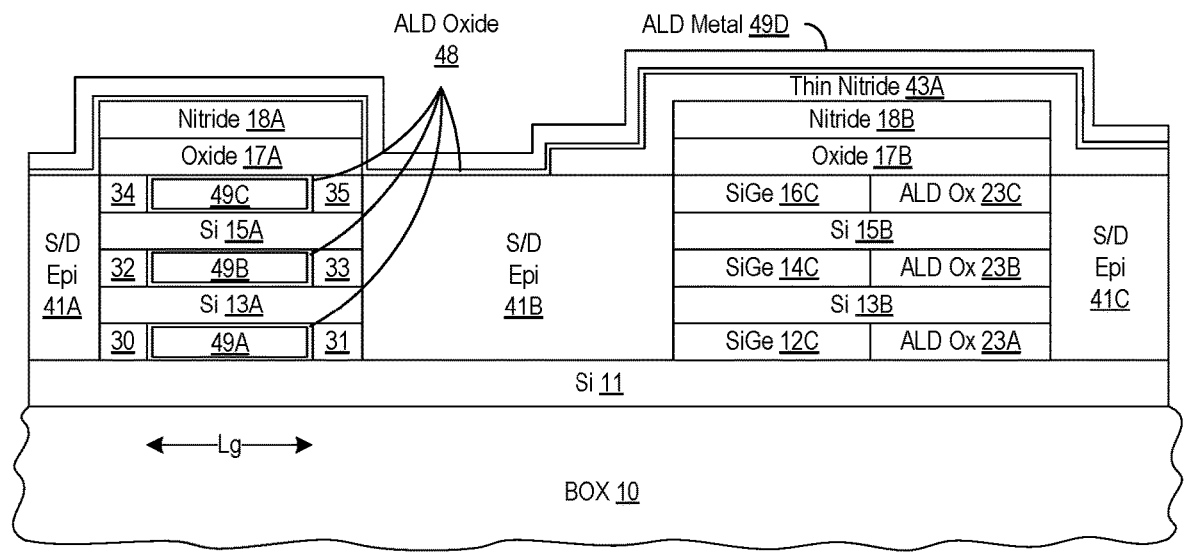
FIG. 20 illustrates processing subsequent to FIG. 19 after an atomic layer deposition (ALD) metal layer is formed as a liner layer to cover the transistor and MEMS sensor stacks and to fill the gate openings of the transistor stack.

FIG. 20 illustrates processing of the semiconductor structure subsequent to FIG. 19 after one or more conductive gate electrode layers 49A-49D are formed to cover the transistor and MEMS sensor stacks and to fill the gate openings of the transistor stack. In selected embodiments, the conductive gate electrode layer(s) 49 are formed with an atomic layer deposition (ALD) process to conformally deposit at least a first ALD metal layer 49A-C on the ALD oxide layers 48 to at least partially fill the remaining gate openings 45-47. In selected embodiments, the ALD metal deposition process may by implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 49A-49C in the gate openings 45-47, the ALD metal process forms an ALD metal layer 49D as a substantially conformal layer over the upper surface of the semiconductor structure.

Figure 21:
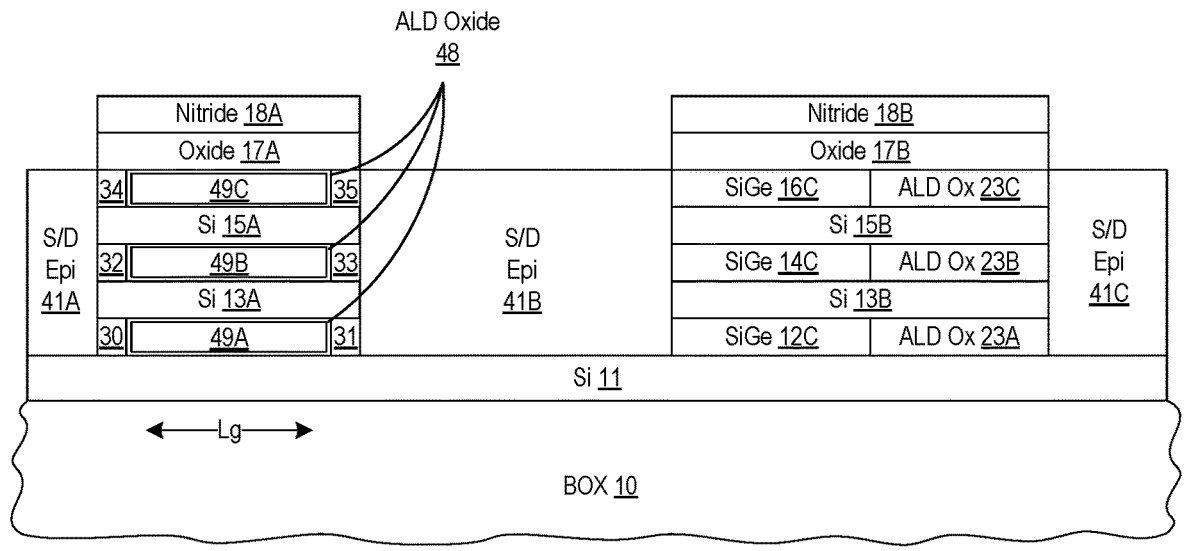
FIG. 21 illustrates processing subsequent to FIG. 20 after removing the ALD metal layer, ALD oxide layer, and third etch mask from the upper surface of the transistor and MEMS sensor stacks.

FIG. 21 illustrates processing of the semiconductor structure subsequent to FIG. 20 after applying one or more etch processes to remove the ALD metal layer 49D, surface ALD oxide layer 48, and third etch mask 43A from the upper surface of the transistor and MEMS sensor stacks. While any suitable etch process may be used, the etch processing can include one or more isotropic etching steps (e.g., RIE) having suitable etch chemistry properties to remove, in sequence, the ALD metal layer 49D from the surface of the semiconductor structure, the ALD oxide layer 48 from the surface of the semiconductor structure, and the third etch mask 43A from the MEMS sensor stack. The etch processing should leave the transistor and MEMS sensor stacks in place and covered by the protective oxide layers 17A, 17B and nitride layers 18A, 18B. Again, the sidewalls of the protective oxide layers 17A, 17B and nitride layers 18A, 18B are shown as being substantially vertical, though minor deviations in the sidewall profile may occur at each layer due to etch processing variations.

Figure 22:
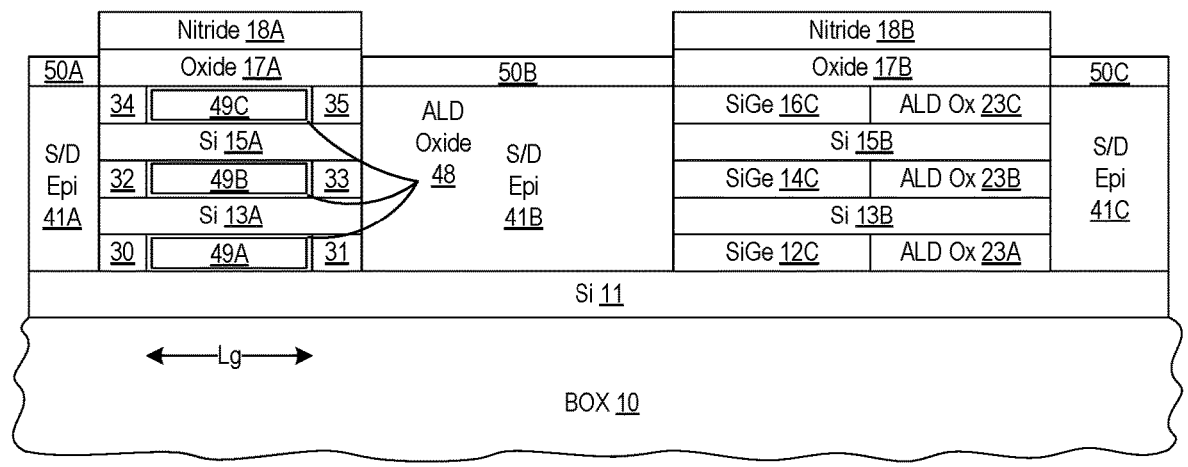
FIG. 22 illustrates processing subsequent to FIG. 21 after selectively forming silicide layers on exposed source/drain regions.

FIG. 22 illustrates processing of the semiconductor structure subsequent to FIG. 21 after selectively forming silicide layers 50A-50C on exposed epitaxial source/drain regions 41A-41C. As formed, the silicide layers 50A-50C facilitate electrical connection to the epitaxial source/drain regions 41A-41C. While any desired silicide formation process may be used to form the silicide layers 50A-50C (such as CoSi2 or NiSi), an example silicide formation sequence would be to deposit or sputter a conductive metal layer (e.g., cobalt or nickel) over the semiconductor structure, followed by a heating step to react the metal layer with the source/drain regions 41A-41C to form silicide layers 50A-50C. In an illustrative embodiment, the reaction of the metal layer and the source/drain regions 41A-41C is promoted by performing an initial rapid thermal anneal step (e.g., 400-600° C.), followed by a Piranha clean step to remove excess metal, and then followed by a second rapid thermal anneal step (e.g., 650-850° C.). The time and temperature of the initial rapid thermal anneal step are selected so that the metal layer reacts with the exposed surfaces of the source/drain regions 41A-41C. After the Piranha clean step, the time and temperature of the second rapid thermal anneal step are selected so that the reacted silicide 50 is driven into a low resistivity phase.

At the process stage shown in FIG. 22, the fabrication of the nanosheet transistors in the transistor stack is complete, with a first nanosheet transistor including the first silicon channel region 13A under control of a gate electrode 49A, 49B, a second nanosheet transistor including the second silicon channel region 15A under control of a gate electrode 49B, 49C, and a third planar FET transistor including the third silicon channel region 11 under control of the gate electrode 49A. The only remaining steps are to process the MEMS sensor stack to form silicon cantilevers from the suspended silicon nanosheets.

Figure 23:
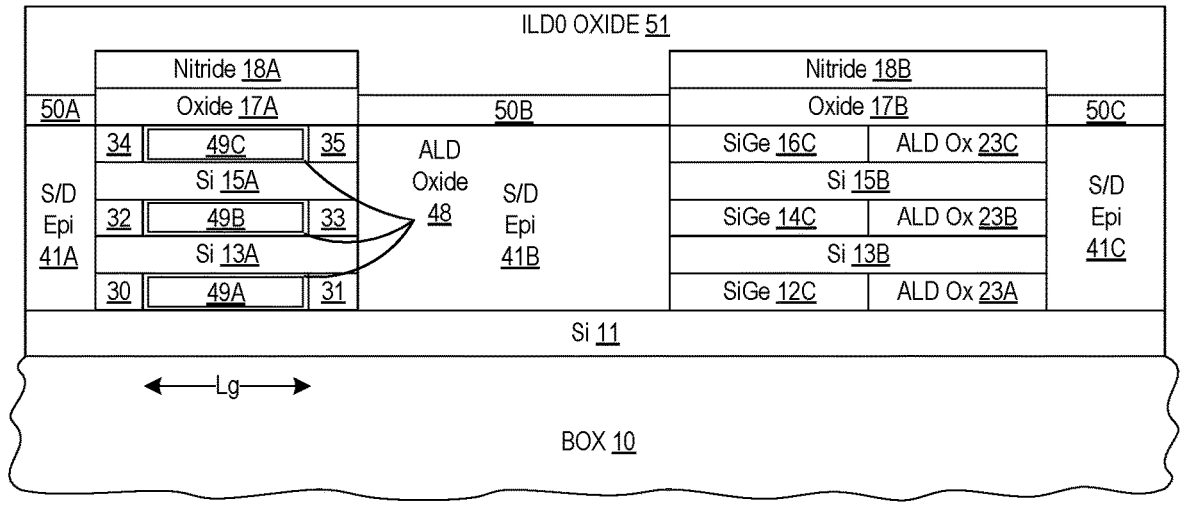
FIG. 23 illustrates processing subsequent to FIG. 22 after forming a planarized first interlayer dielectric oxide layer over the transistor and MEMS sensor stacks.

To this end, reference is now made to FIG. 23 which illustrates processing of the semiconductor structure subsequent to FIG. 22 after forming a first interlayer dielectric (ILD) layer 51 over the transistor and MEMS sensor stacks. While any suitable deposition process may be used, the first ILD layer 51 may be formed by depositing and planarizing an oxide material over the transistor and MEMS sensor stacks on the semiconductor structure. In selected embodiments, the planarized ILD oxide layer 51 may be formed with a low-temperature oxide (LTO) or spin-on dielectric film. In addition or in the alternative, one or more etch or polish steps may be applied to planarize the top surface of the ILD oxide layer 51, such as by using a chemical mechanical polish (CMP) process. Though not shown, it will be appreciated that conductive contact structures or vias may also be formed in the planarized ILD oxide layer 51.

Figure 24:
FIG. 24 illustrates processing subsequent to FIG. 23 after selectively etching a narrow trench opening through the planarized first interlayer dielectric oxide layer to form silicon nanosheet gaps in the MEMS sensor stack.
Figure 24:
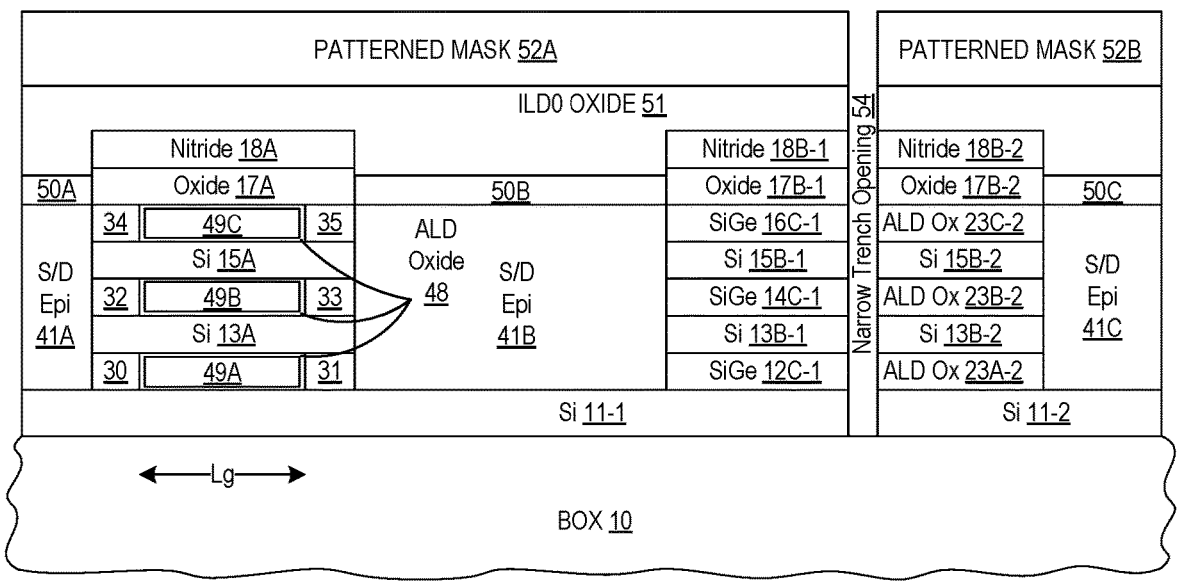

FIG. 24 illustrates processing of the semiconductor structure subsequent to FIG. 23 after the planarized first ILD oxide layer 51 is patterned and etched with a narrow trench etch process 53 to selectively etch a narrow trench opening 54 through the first ILD oxide layer 51 and the MEMS sensor stack to form silicon nanosheet gaps in the MEMS sensor stack. While any suitable narrow trench etch process 53 may be used, a first patterned mask 52A, 52B may be formed over the first ILD oxide layer 51 by depositing, patterning, etching or developing a photoresist or hard mask layer on the first ILD oxide layer 51, such as by using extreme ultraviolet (EUV) lithography techniques. With the patterned photoresist mask 52A, 52B in place, one or more etch processes are applied to create the narrow trench opening 54 into the MEMS sensor stack. The narrow trench etch process 53 can include using the patterned photoresist mask 52A, 52B to perform a sequence of reactive-ion etching (RIE) steps having suitable etch chemistry properties to remove, in sequence, the exposed portions of the first ILD oxide layer 51, the protective nitride layer 18B, protective oxide layer 17B, and underlying layers of the MEMS sensor stack 11/12C/13B/14C/15B/16C. The narrow trench etch process 53 is controlled to form the narrow trench opening 54 to have a high aspect ratio. In addition, the narrow trench etch process 53 is controlled to position the narrow trench opening 54 in the MEMS sensor stack to expose the SiGe layers 12C, 14C, 16C. Finally, the narrow trench etch process 53 is controlled so that the narrow trench opening 54 separates the exposed SiGe layers 12C-1, 14C-1, 16C-1 and remnant Si layers 11-1, 13B-1, 15B-1 on the first interior side of the MEMS sensor stack from the remnant ALD oxide layers 23A-2, 23B-2, 23C-2 and remnant Si layers 11-2, 13B-2, 15B-2 on the second exterior side of the MEMS sensor stack. As will be appreciated, the sidewalls of the narrow trench opening 54 are substantially vertical, though minor deviations in the sidewall profile may occur at each layer due to etch processing variations.

Figure 25:
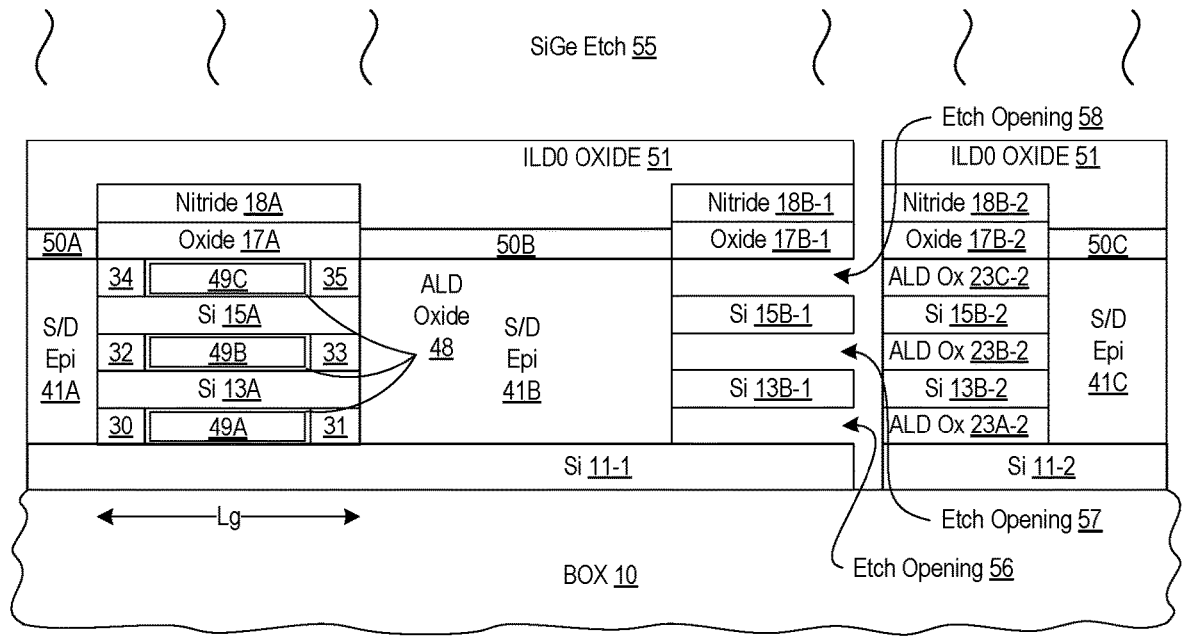
FIG. 25 illustrates processing subsequent to FIG. 24 after selectively etching exposed SiGe layers in the MEMS sensor stack exposed by the narrow trench opening to form silicon cantilever structures in the MEMS sensor stack.

FIG. 25 illustrates processing of the semiconductor structure subsequent to FIG. 24 after applying a SiGe etch process 55 through the narrow trench opening 54 to selectively etch exposed SiGe layers 12C/14C/16C to form the etch openings 56-58 which define silicon cantilever structures from the remnant Si layers 13B-1, 15B-1 on the first interior side of the MEMS sensor stack. While any suitable SiGe etch process may be used, a selective isotropic SiGe etch process 55, such as a timed isotropic dry etch, may be used to remove the exposed remnant SiGe layers 12C, 14C, 16C from the MEMS sensor stack. At the conclusion of the SiGe etch process 55, the remnant SiGe portions 12C, 14C, 16C of the MEMS sensor stack are replaced by etch openings 56-58 which surround and suspend the remnant Si layers 13B-1, 15B-1 forming the silicon cantilever electrodes for the MEMS sensor device. By controlling the placement and width of the narrow trench opening, there is a defined gap between the silicon cantilever electrodes 13B-1, 15B-1 (on the first interior side of the MEMS sensor stack) and the silicon fixed electrodes 13B-2, 15B-2 (on the second exterior side of the MEMS sensor stack). By reducing the width of the gap, the capacitive coupling is increased between the silicon cantilever electrodes 13B-1, 15B-1 and the silicon fixed electrodes 13B-2, 15B-2. In selected embodiments, the effectiveness of the SiGe etch process 55 may be assisted by using the narrow trench etch process 53 to open a larger contact hole (not shown) away from silicon nanosheets 13B, 15B (e.g., in the z-direction of the drawings) to help with isotropic etching of the exposed SiGe layers 12C/14C/16C.

As illustrated at this stage of the fabrication process, the silicon cantilever electrodes 13B-1, 15B-1 are anchored on the left of the MEMs sensor stack by their connection to the epitaxial source/drain region 41B (which was epitaxially grown at least in part from the silicon layers 13B, 15B, as shown in FIG. 14). In selected embodiments, additional anchoring for the silicon cantilever electrodes 13B-1, 15B-1 can be provided by forming oxide spacers (not shown) on the left side of the MEMS sensor stack at the peripheral side edge where the SiGe layers 12C, 14C, 16C were originally located in the MEMs sensor stack prior to being removed by the SiGe etch process 55. In selected embodiments, such oxide spacers can formed by processing the left side of the MEMS sensor stack with an additional mask and selective SiGe etch sequence (e.g., after the processing depicted in FIG. 5) to replace the first etch mask 20A with another mask which exposes only the first interior side of the MEMS sensor stack and then partially recess the SiGe layers 12C, 14C, 16C on the first interior side of the MEMS sensor stack to form left side recess openings before forming the ALD oxide layer 23 which would fill the left side recess openings to form the oxide spacers. Alternatively, the oxide spacers can be formed by processing the left side of the MEMs sensor stack at the same time the inner spacers 36 are formed in the transistor stack, such as by forming the second etch mask 26A to cover only the second, exterior side of the MEMs sensor stack so that the selective SiGe recess etch process 29 partially recesses the SiGe layers 12C, 14C, 16C on the first interior side of the MEMS sensor stack to form left side recess openings before forming the inner spacers 36 which would fill the left side recess openings to form the oxide spacers. With such oxide spacers located above and below each of the silicon cantilever electrodes 13B-1, 15B-1 on the left side next to the epitaxial source/drain region 41B, additional structural support is provided for the silicon cantilever electrodes 13B-1, 15B-1.

Figure 26:
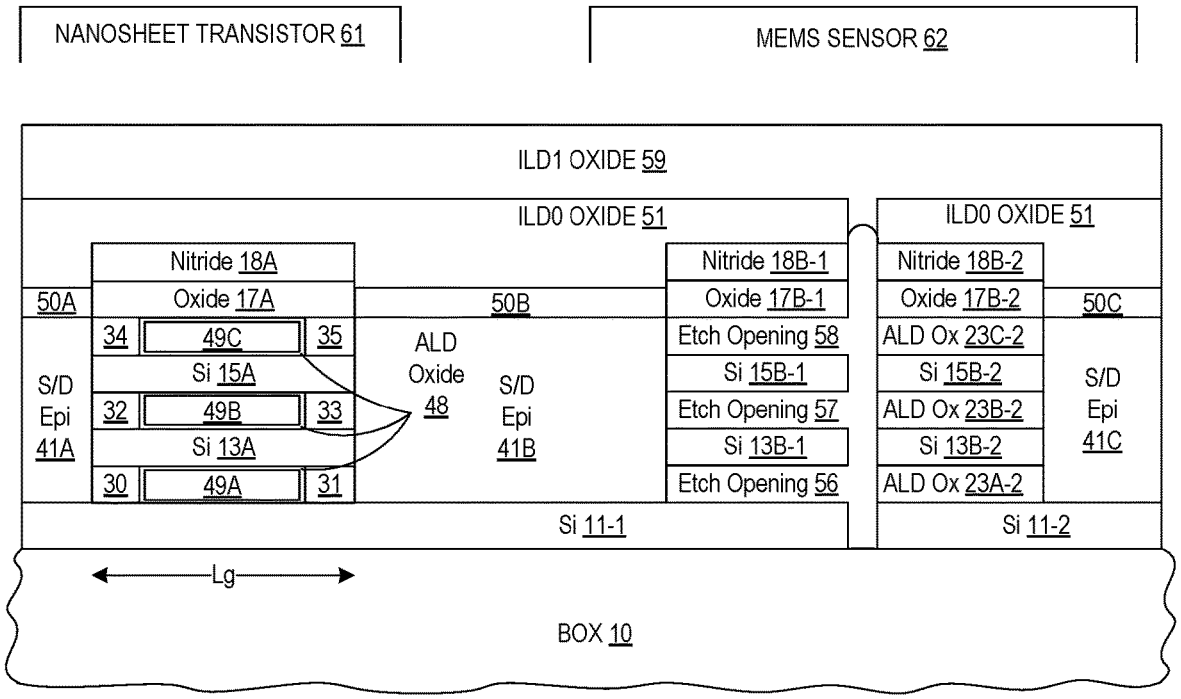
FIG. 26 illustrates processing subsequent to FIG. 25 after forming a planarized second interlayer dielectric oxide layer over the planarized first interlayer dielectric oxide layer to seal the top of the narrow trench opening in the MEMS sensor stack.

FIG. 26 illustrates processing of the semiconductor structure subsequent to FIG. 25 after forming a second interlayer dielectric (ILD) layer 59 over the first ILD layer 51 to seal the top of the narrow trench opening 54 in the MEMS sensor stack. While any suitable deposition process may be used, the second ILD layer 59 may be formed by depositing and planarizing an oxide material having poor step coverage over the first ILD layer 51. In selected embodiments, the planarized oxide layer 59 may be formed with a PECVD oxide layer which pinches off the top of the narrow trench opening 54 without filling the interior space of the MEMS sensor stack, leaving open the etch openings 56-58 which define the silicon cantilever electrodes.

As a result of the processing steps illustrated in FIGS. 1-26, there is provided a nanosheet transistor 61 and nanosheet MEMS sensor 62 formed on a single die with a single nanosheet process flow, thereby providing a straightforward method for integrating MEMS sensors with advanced nanosheet transistors on the same die. While specific implementation details are described herein for integrating the fabrication of MEMS sensors with the nanosheet transistor process flow to make dual use of fabrication steps, it will be appreciated that additional or fewer processing steps may be used and/or combined. For example, a shared set of fabrication steps may be used to pattern and etch an initial Si/SiGe superlattice substrate structure 11-18 to form separate transistor and MEMS sensor stacks which are processed using nanosheet process steps to form separate transistor and MEMS sensor stacks where SiGe layers 12, 14, 16 are selectively recessed and/or removed with a sequence of SiGe etch steps which are applied to the transistor stack and to different sides of the MEMS sensor stack. In the SiGe etch openings 45-47 of the transistor stack, layers of ALD oxide 48 and metal 49 are sequentially deposited to form transistor gate electrodes. In SiGe etch openings on a first side of the MEMS sensor stack, ALD oxide layers are deposited and etched to delineate a first stack of silicon layers forming fixed capacitive electrodes. In addition, the SiGe etch openings 56-58 on the second side of the MEMS sensor stack are formed to delineate a second stack of silicon layers forming cantilevered capacitive electrodes. By forming a narrow trench opening 54 in the MEMS sensor stack to access and etch SiGe layers 12C, 14C, 16C and positioning the narrow trench opening 54 between the fixed capacitive electrodes and the cantilevered capacitive electrodes, a MEMS capacitor sensor is formed for use in acceleration and/or vibration sensing.

In addition to the processing steps illustrated in FIGS. 1-26, additional processing steps may be included in other embodiments. For example, the capacitive coupling between the fixed and cantilevered capacitive electrodes can be increased by forming a polysilicon plate on top of MEMS Si cantilevers to increase capacitive coupling with top Si cantilever, and by also building a dielectrically isolated polysilicon or Si plate underneath MEMS Si cantilevers to increase capacitive coupling with bottom Si cantilever. In addition, a separate Si/SiGe stack may be built for a MEMS sensor based on a different Si—SiGe stack having different thicknesses for the Si and SiGe layers to create a different vertical spacing between the cantilevered capacitive electrodes and a different thickness for the cantilevered capacitive electrodes. By providing an additional MEMS sensor stack with different Si and SiGe thicknesses, MEMS device performance can be separately optimized.

In addition to the processing steps illustrated in FIGS. 1-26, it will be appreciated that additional processing steps may be used to pattern and etch gate electrodes on the transistor stacks following the deposition of the ALD metal layer 49. These gate electrodes remain on the tops and sidewalls of the transistor stacks and may or may not include dielectric spacers. These gate electrodes complete the gate-all-around structure for the transistors.

It will also be appreciated that the ordering and sequence of processing steps illustrated in FIGS. 1-26 can be changed and adjusted to build the transistor stack first (including epitaxial source/drain regions and gate electrodes), protect it with one or more suitable mask layers (e.g., nitride), and then build the sensor stack (or vice versa). In this approach, selected transistor stack processing steps (such as illustrated in FIGS. 11-12, 14-15, 18-20, and 22-23) may be performed first while the MEMS sensor stack is masked, followed by performing selected sensor stack processing steps (such as illustrated in FIGS. 3-8, 14, and 22-26) while the transistor stack is masked. Alternatively, the sensor stack processing steps can be performed first while the transistor stack is masked, followed by processing of the transistor stack while the sensor stack is masked. This bifurcated approach for separately processing the transistor and sensor stacks advantageously eliminates some of the selective mask formation steps (e.g., FIGS. 9-10 and 16-17), and also enables the two transistor and sensor stack structures to be as independent as possible to provide for separate optimization.

Figure 27:
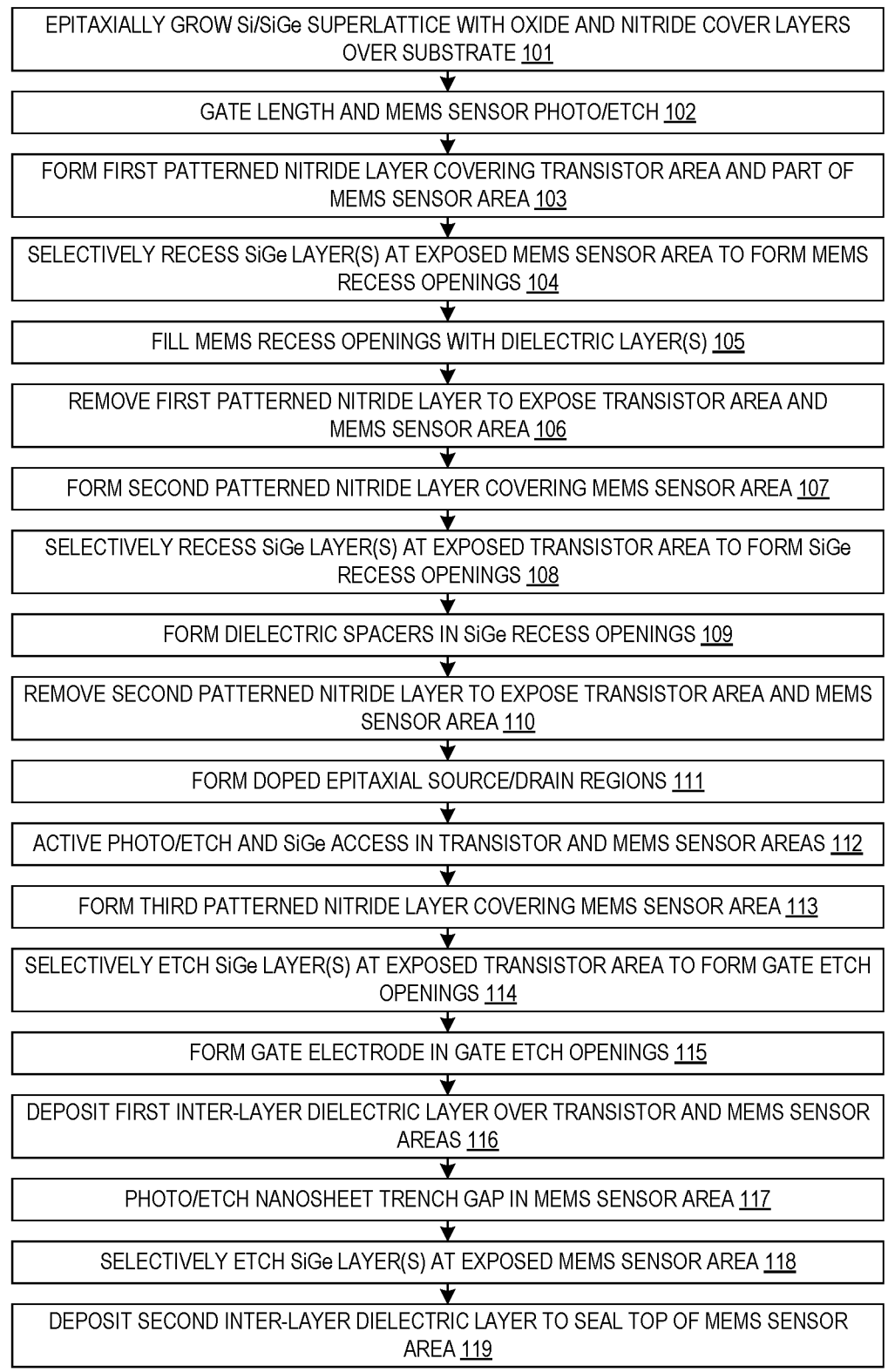
FIG. 27 illustrates a simplified process flow for integrating the fabrication of nanosheet transistors and MEMS sensors in accordance with selected embodiments of the present disclosure.

FIG. 27 illustrates a simplified process flow for integrating the fabrication of nanosheet transistors and MEMS sensors in accordance with selected embodiments of the present disclosure. The process begins at step 101 with a wafer substrate which is processed to form a silicon/silicon germanium superlattice structure on the wafer substrate. In selected embodiments, the silicon/silicon germanium superlattice structure is formed as a Si/SiGe epi stack by epitaxially growing alternating layers of Si and SiGe on an silicon on insulator (SOI) substrate layer, and then covering the Si/SiGe epi stack by sequentially depositing an oxide layer and protective nitride layer.

At step 102, the Si/SiGe epi stack is processed with a gate length and MEMS sensor photo/etch process. For example, a photoresist layer may be deposited, patterned, etched and developed to form a patterned photoresist or hard mask layer on the protective nitride layer. With the patterned photoresist/hard mask layer in place, the processing at step 102 may include applying one or more etch processes to create a transistor stack and MEMS sensor stack. The etch process can include a sequence of reactive-ion etching (RIE) steps having suitable etch chemistry properties to sequentially remove exposed portions of the protective nitride layer, oxide layer, and underlying layers of the Si/SiGe epi stack.

At step 103, a first patterned nitride layer or etch mask is formed to cover the transistor area and part of the MEMS sensor area. For example, a thin nitride layer may be deposited over the semiconductor structure, and then patterned and isotropically etched to cover the transistor stack and a first side of the MEMS sensor stack, thereby exposing the second side of the MEMs sensor stack.

At step 104, the SiGe layers at the exposed second side of the MEMS sensor stack are selectively etched or recessed to form MEMS recess openings. For example, a controlled etch process, such as a timed isotropic dry etch, may be applied to selectively recess the SiGe layers exposed at the second side of the MEMS sensor stack, thereby forming recess cavities in the MEMS sensor stack by partially recessing the SiGe layers.

At step 105, the MEMS recess openings are filled with one or more dielectric layers. For example, the MEMS recess openings may be filled by depositing an oxide layer on at least the second side of the MEMS sensor stack using a thin film technology, chemical vapor deposition, plasma enhanced chemical vapor deposition, molecular beam epitaxy, sputtering, and/or atomic layer deposition. The deposited dielectric/oxide layer(s) may be isotropically etched to leave the dielectric/oxide layer(s) only in the MEMS recess openings.

At step 106, the first patterned nitride layer or etch mask is removed to expose the transistor area and MEMS sensor area. For example, the first patterned nitride layer or etch mask may be removed with any suitable isotropic nitride etch process which removes or strips the first patterned nitride layer/etch mask, leaving the transistor and MEMS sensor stacks exposed.

At step 107, a second patterned nitride layer or etch mask is formed to cover the MEMS sensor area. For example, a thin nitride layer may be deposited over the semiconductor structure, and then patterned and isotropically etched to cover the MEMS sensor stack, thereby exposing the transistor stack.

At step 108, the SiGe layers at the exposed transistor area/transistor stack are selectively etched or recessed to form SiGe recess openings, leaving remnant SiGe layers in the transistor stack. For example, a controlled etch process, such as a timed isotropic dry etch, may be applied to selectively recess the SiGe layers exposed at peripheral sides of the transistor stack, thereby forming SiGe recess openings in the transistor stack.

At step 109, dielectric spacers are formed in the SiGe recess openings of the transistor stack. For example, an inner nitride layer may be deposited over the semiconductor structure, and then patterned and isotropically etched to leave the inner nitride layer only in the SiGe recess openings of the transistor stack.

At step 110, the second patterned nitride layer or etch mask is removed to expose the transistor area and MEMS sensor area. For example, the second patterned nitride layer/etch mask may be removed with any suitable isotropic nitride etch process which removes or strips the second patterned nitride layer/etch mask, leaving the transistor and MEMS sensor stacks exposed.

At step 111, doped source/drain epitaxial layers are formed around the transistor and MEMS sensor stacks. For example, an epitaxial semiconductor process may be applied to form epitaxial semiconductor layers in the intended source/drain regions which are doped using any suitable doping technique. For example, the epitaxial source/drain regions may be in-situ doped during the epitaxial semiconductor process, such as by doping epitaxially grown source/drain features with boron, carbon and/or phosphorus to form doped epitaxial source/drain regions. In addition or in the alternative, an implantation process is performed to dope the epitaxial source/drain regions. As will be appreciated, the doping process may be controlled and applied in separate processing sequences for each of N-type and P-type source/drain features. In addition, the formation of doped epitaxial source/drain regions may include one or more anneal processes to promote formation of crystalline structures in the epitaxial source/drain regions and/or may include one or more etch or polish steps at a later stage in the process flow to planarize the top surface of the epitaxial source/drain regions.

At step 112, the transistor and MEMS sensor areas are processed with an active photo/etch process to access the underlying SiGe layers in the transistor stack. For example, a photoresist layer may be deposited, patterned, etched and developed to form a patterned photoresist or hard mask layer with mask openings positioned over the transistor stack to access the underlying SiGe layers in the transistor stack. With the patterned photoresist/hard mask layer in place, the processing at step 112 may include applying one or more etch processes to access the underlying SiGe layers in the transistor stack. The etch process can include a sequence of reactive-ion etching (RIE) steps having suitable etch chemistry properties to sequentially remove exposed portions of the underlying layers, but without removing the accessed SiGe layers.

At step 113, a third patterned nitride layer or etch mask is formed to cover the MEMS sensor area. For example, a thin nitride layer may be deposited over the semiconductor structure, and then patterned and isotropically etched to cover the MEMS sensor stack, thereby exposing the gate stack.

At step 114, the SiGe layers at the exposed transistor area/transistor stack are selectively etched to form gate etch openings by removing the remnant SiGe layers in the transistor stack. For example, a controlled etch process, such as a timed isotropic dry etch, may be applied to selectively etch and remove the SiGe layers exposed at the transistor stack, thereby forming gate etch openings where the remnant SiGe layers were located in the transistor stack.

At step 115, gate electrodes are formed in the gate etch openings of the transistor stack. For example, the gate electrodes may be formed by depositing an ALD oxide layer to form a conformal thin dielectric layer in the gate etch openings of the transistor stack, and then depositing an ALD metal layer to form gate electrodes by filling the gate etch openings. To clear the top surface of the transistor and MEMS sensors stacks and doped source/drain epitaxial layers, one or more etch processes may be applied which have suitable etch chemistry properties to sequentially remove the ALD metal layer and ALD oxide layer formed on the top surface of the semiconductor structure. In addition, additional etching may be applied to remove the third patterned nitride layer/etch mask so that silicide layers may be selectively formed on the exposed source/drain epitaxial layers.

At step 116, a first inter-layer dielectric (ILD) layer is deposited over the transistor and MEMS sensor areas. For example, the first ILD layer may be formed by depositing and planarizing an oxide material over the transistor and MEMS sensor stacks, such as by forming a low-temperature oxide (LTO) or spin-on dielectric film that may be etched or polished to planarize the top surface of the ILD layer.

At step 117, the MEMS sensor stack is processed with a photo/etch process to form a nanosheet trench gap. For example, a photoresist layer may be deposited, patterned, etched and developed to form a patterned photoresist or hard mask layer on the first ILD layer. With the patterned photoresist mask in place, one or more etch processes, such as an extreme ultraviolet (EUV) lithography process, are applied to create a narrow trench opening into the MEMS sensor stack by selectively etching through the first ILD layer and the MEMS sensor stack to form the nanosheet trench gap in the MEMS sensor stack. The narrow trench etch process is controlled to form a high aspect ratio narrow trench opening that is positioned in the MEMS sensor stack to expose the underlying SiGe layers and to separate exposed SiGe layers and remnant Si layers on one side of the MEMS sensor stack from the dielectric layers and remnant Si layers on the other side of the MEMS sensor stack.

At step 118, the SiGe layers in the MEMS sensor area that are exposed by the narrow trench opening are selectively etched to form etch openings by removing the remnant SiGe layers in the MEMS sensor stack. For example, a controlled etch process, such as a timed isotropic dry etch, may be applied to selectively etch and remove the exposed SiGe layers in the MEMS sensor stack, thereby forming silicon cantilever electrodes from the silicon layers in the nanosheet sensor stack that are suspended after removing the SiGe layers from the MEMS sensor area.

At step 119, a second inter-layer dielectric (ILD) layer is deposited over the first ILD layer to seal the top of the MEMS sensor area. For example, the second ILD layer may be formed by depositing and planarizing an oxide material having poor step coverage over the first ILD layer, such as by depositing a PECVD oxide layer which pinches off the top of the narrow trench opening without filling the interior space of the MEMS sensor stack, leaving open the etch openings which define the silicon cantilever electrodes.

It will be appreciated that additional processing steps will be used to complete the fabrication of the gate electrodes into functioning transistors or devices. As examples, one or more sacrificial oxide formation, stripping, isolation region formation, extension implant, halo implant, spacer formation, source/drain implant, heat drive or anneal steps, and polishing steps may be performed, along with conventional backend processing (not depicted) typically including formation of multiple levels of interconnect that are used to connect the transistors in a desired manner to achieve the desired functionality. Thus, the specific sequence of steps used to complete the fabrication of the gate electrodes may vary, depending on the process and/or design requirements.

By now it should be appreciated that there has been provided a method for fabricating a semiconductor device which integrates the nanosheet transistors and sensors, such as MEMS sensors or capacitors. In the disclosed fabrication method, a stack of alternating first and second semiconductor layers is provided on a substrate. The disclosed fabrication method also selectively etches the stack of alternating first and second semiconductor layers to form a transistor stack and a sensor stack on the substrate. In addition, the disclosed fabrication method processes the transistor stack and the sensor stack to form gate electrodes between the first semiconductor layers in the transistor stack and to form cantilever electrodes from the first semiconductor layers in the sensor stack. In selected embodiments, the processing of the transistor stack and a sensor stack also includes processing the sensor stack to form fixed electrodes from the first semiconductor layers in the sensor stack. In selected embodiments, the first semiconductor layer is a silicon nanosheet layer, and the second semiconductor layer is a silicon germanium nanosheet layer. In other embodiments, the first and second semiconductor layers are formed, respectively, with first and second semiconductor materials having different isotropic etch rates from one another.

In another form, there has been provided a method for fabricating a semiconductor device with integrated nanosheet transistors and MEMS sensors. In the disclosed fabrication method, a stack of alternating silicon and silicon germanium layers is provided on a substrate. In selected embodiments, the stack of alternating silicon and silicon germanium layers is provided by epitaxially growing alternating layers of silicon and silicon germanium on the substrate. The disclosed fabrication method also selectively etches the stack of alternating silicon and silicon germanium layers to form a nanosheet transistor stack and a nanosheet sensor stack on the substrate. In addition, the disclosed fabrication method selectively processes the nanosheet sensor stack while masking the nanosheet gate stack to form silicon fixed electrodes from the silicon layers in the nanosheet sensor stack by forming one or more dielectric layers on a first side of the nanosheet sensor stack which replace a portion of the silicon germanium layers in the nanosheet sensor stack and leave remnant silicon germanium layers in the nanosheet sensor stack. In selected embodiments, the nanosheet sensor stack is selectively processed by partially recessing silicon germanium layers from the first side of the nanosheet sensor stack to form recess cavities in the nanosheet sensor stack, and then filling the recess cavities with dielectric material to form the one or more dielectric layers on the first side of the nanosheet sensor stack. In such embodiments, the recess cavities may be filled with dielectric material by depositing an oxide layer on at least the first side of the nanosheet sensor stack using a thin film technology comprising chemical vapor deposition, plasma enhanced chemical vapor deposition, molecular beam epitaxy, sputtering, and/or atomic layer deposition. The disclosed fabrication method also selectively processes the nanosheet transistor stack while masking the nanosheet sensor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack. In selected embodiments, the nanosheet transistor stack is selectively processed by partially recessing silicon germanium layers from peripheral sides of the nanosheet transistor stack to form recess cavities adjacent to remnant silicon germanium layers in the nanosheet transistor stack, and then filling the recess cavities with one or more dielectric layers to form dielectric spacers on peripheral sides of the nanosheet transistor stack. In such embodiments, the recess cavities may be filled by depositing a nitride layer on at least the nanosheet transistor stack using a thin film technology comprising chemical vapor deposition, plasma enhanced chemical vapor deposition, molecular beam epitaxy, sputtering, and/or atomic layer deposition, and then etching the nitride layer to form the nitride spacers on peripheral sides of the remnant silicon germanium layers in the nanosheet transistor stack. In addition, the disclosed fabrication method forms doped epitaxial semiconductor regions adjacent to the nanosheet transistor stack and a nanosheet sensor stack. In addition, the disclosed fabrication method selectively processes the nanosheet transistor stack while masking the nanosheet sensor stack to form gate electrodes which replace the remnant silicon germanium layers in the nanosheet transistor stack. In selected embodiments, the silicon cantilever electrodes are formed from the silicon layers by forming an etch mask over the nanosheet transistor stack and a nanosheet sensor stack with a mask opening positioned over the nanosheet sensor stack; selectively etching portions of the nanosheet sensor stack exposed by the mask opening to form the narrow trench opening in the nanosheet sensor stack which exposes the remnant silicon germanium layers on the second side in the nanosheet sensor stack; and selectively removing the remnant silicon germanium layers from the second side of the nanosheet sensor stack. In such embodiments, the mask opening is positioned over the nanosheet sensor stack to form the narrow trench opening between the silicon fixed electrodes on the first side of the nanosheet sensor stack and the silicon cantilever electrodes on the second side of the nanosheet sensor stack. The disclosed fabrication method also deposits one or more dielectric layers over the nanosheet transistor stack and a nanosheet sensor stack to seal the top of the narrow trench opening. In selected embodiments, the deposition of one or more dielectric layers includes depositing an interlayer dielectric oxide material having poor step coverage to seal the top of the narrow trench opening without filling the remainder of the narrow trench opening.

In yet another form, there has been provided a method for fabricating a semiconductor device with integrated nanosheet transistors and MEMS sensors. In the disclosed fabrication method, a stack of alternating silicon and silicon germanium layers is provided on a substrate. The disclosed fabrication method also selectively etches the stack of alternating silicon and silicon germanium layers to form a nanosheet transistor stack and a nanosheet sensor stack on the substrate. In addition, the disclosed fabrication method selectively processes the nanosheet sensor stack by performing nanosheet sensor stack processing steps while masking the nanosheet transistor stack. The nanosheet sensor stack processing steps include forming silicon fixed electrodes from the silicon layers in the nanosheet sensor stack by forming one or more dielectric layers on a first side of the nanosheet sensor stack which replace a portion of the silicon germanium layers in the nanosheet sensor stack and leave remnant silicon germanium layers in the nanosheet sensor stack. In selected embodiments, the nanosheet sensor stack processing steps to form silicon fixed electrodes include partially recessing silicon germanium layers from the first side of the nanosheet sensor stack to form recess cavities in the nanosheet sensor stack, and filling the recess cavities with dielectric material to form the one or more dielectric layers on the first side of the nanosheet sensor stack. In such embodiments, the recess cavities may be filled with dielectric material by depositing an oxide layer on at least the first side of the nanosheet sensor stack using a thin film technology comprising chemical vapor deposition, plasma enhanced chemical vapor deposition, molecular beam epitaxy, sputtering, and/or atomic layer deposition. The nanosheet sensor stack processing steps also form doped epitaxial semiconductor regions adjacent to the nanosheet sensor stack. In addition, the nanosheet sensor stack processing steps form silicon cantilever electrodes from the silicon layers in the nanosheet sensor stack by forming a narrow trench opening in the nanosheet sensor stack to expose the remnant silicon germanium layers on a second side in the nanosheet sensor stack and selectively removing the remnant silicon germanium layers in the nanosheet sensor stack. In selected embodiments, the nanosheet sensor stack processing steps to form silicon cantilever electrodes include forming an etch mask with a mask opening positioned over the nanosheet sensor stack; selectively etching portions of the nanosheet sensor stack exposed by the mask opening to form the narrow trench opening in the nanosheet sensor stack which exposes the remnant silicon germanium layers on the second side in the nanosheet sensor stack; and selectively removing the remnant silicon germanium layers from the second side of the nanosheet sensor stack, where the mask opening is positioned over the nanosheet sensor stack to form the narrow trench opening between the silicon fixed electrodes on the first side of the nanosheet sensor stack and the silicon cantilever electrodes on the second side of the nanosheet sensor stack. The disclosed fabrication method also selectively processes the nanosheet transistor stack by performing nanosheet transistor stack processing steps while masking the nanosheet sensor stack. The nanosheet transistor stack processing steps form dielectric spacer layers on peripheral sides of the nanosheet transistor stack which replace peripheral portions of the silicon germanium layers in the nanosheet transistor stack and leave remnant silicon germanium layers in the nanosheet transistor stack. In selected embodiments, the nanosheet transistor stack processing steps to form dielectric spacer layers include partially recessing silicon germanium layers from peripheral sides of the nanosheet transistor stack to form recess cavities adjacent to remnant silicon germanium layers in the nanosheet transistor stack, and filling the recess cavities with one or more dielectric layers to form dielectric spacers on peripheral sides of the nanosheet transistor stack. In such embodiments, the recess cavities may be filled by depositing a nitride layer on at least the nanosheet transistor stack using a thin film technology comprising chemical vapor deposition, plasma enhanced chemical vapor deposition, molecular beam epitaxy, sputtering, and/or atomic layer deposition, and etching the nitride layer to form the nitride spacers on peripheral sides of the remnant silicon germanium layers in the nanosheet transistor stack. The nanosheet transistor stack processing steps also form doped epitaxial semiconductor regions adjacent to the nanosheet transistor stack. In addition, the nanosheet transistor stack processing steps form gate electrodes which replace the remnant silicon germanium layers in the nanosheet transistor stack. In addition, the disclosed fabrication method deposits one or more dielectric layers over the nanosheet transistor stack and a nanosheet sensor stack to seal the top of the narrow trench opening, such as by depositing an interlayer dielectric oxide material having poor step coverage to seal the top of the narrow trench opening without filling the remainder of the narrow trench opening. In selected embodiments, the selectively processing of the nanosheet sensor stack occurs before selectively processing of the nanosheet transistor stack. In other embodiments, the selectively processing of the nanosheet transistor stack occurs before selectively processing of the nanosheet sensor stack.

In still yet another form, there is provided a semiconductor device and associated method of fabrication. As disclosed, the semiconductor device includes a transistor stack and a sensor stack formed on top of a substrate. As formed the transistor stack includes a transistor channel region formed with at least first and second semiconductor layers separated from one another in a vertical dimension extending from the substrate, and a control electrode stack at least partially surrounding the first and second semiconductor layers to control current flow through the transistor channel region. In addition, the sensor stack is formed with first electrodes formed with at least third and fourth semiconductor layers extending from a first side of the sensor stack and separated from one another in the vertical dimension; second electrodes formed with at least fifth and sixth semiconductor layers extending from a second side of the sensor stack and separated from one another in the vertical dimension; and an opening in the sensor stack which laterally separates the first and second electrodes. As formed the first, third and fifth semiconductor layers are coplanar semiconductor layers formed over the substrate, and the second, fourth and sixth semiconductor layers are coplanar semiconductor layers formed over the first, third and fifth semiconductor layers. In selected embodiments, each of the first through sixth semiconductor layers is formed with a silicon nanosheet layer. In other embodiments, the first electrodes are fixed electrodes formed with the third and fourth semiconductor layers which are each formed with a silicon nanosheet layer extending from the first side of the sensor stack. In other embodiments, the second electrodes are cantilever electrodes formed with the fifth and sixth semiconductor layers, each formed with a silicon nanosheet layer extending from the second side of the sensor stack.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted nanosheet transistor structures may be formed with different processing steps that can be combined and integrated with MEMS sensor fabrication steps, and can utilize Si/SiGe superlattice structures having different numbers of SiGe and Si layers. Also, the various silicon-based constituent layers may be formed with different conductive materials than those disclosed. For example, the stacked nanosheet layers used to form the nanosheet transistors and MEMS sensors may be formed with materials other than silicon and silicon germanium, provided that the nanosheet layers can be selectively etched with differentiated etch processes. In addition, the Si/SiGe superlattice structures may be formed by epitaxially growing nanosheet layers, or by using other suitable deposition techniques to form the nanosheet layers, including but not limited to forming an ALD seed layer as part of the nanosheet layer(s). In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
    providing a stack of alternating first and second semiconductor layers on a substrate;
    selectively etching the stack of alternating first and second semiconductor layers to form a transistor stack and a sensor stack on the substrate; and
    processing the transistor stack and the sensor stack to form gate electrodes between the first semiconductor layers in the transistor stack and to form cantilever electrodes from the first semiconductor layers in the sensor stack.

2. The method of claim 1, where processing the transistor stack and a sensor stack further comprises processing the sensor stack to form fixed electrodes from the first semiconductor layers in the sensor stack.

3. The method of claim 1, where the first semiconductor layer comprises a silicon nanosheet layer, and where the second semiconductor layer comprises a silicon germanium nanosheet layer.

4. The method of claim 1, where the first and second semiconductor layers are formed, respectively, with first and second semiconductor materials having different isotropic etch rates from one another.

5. A method for forming a semiconductor device comprising:
    providing a stack of alternating silicon and silicon germanium layers on a substrate;
    selectively etching the stack of alternating silicon and silicon germanium layers to form a nanosheet transistor stack and a nanosheet sensor stack on the substrate;
    selectively processing the nanosheet sensor stack while masking the nanosheet transistor stack to form silicon fixed electrodes from the silicon layers in the nanosheet sensor stack by forming one or more dielectric layers on a first side of the nanosheet sensor stack which replace a portion of the silicon germanium layers in the nanosheet sensor stack and leave remnant silicon germanium layers in the nanosheet sensor stack;
    selectively processing the nanosheet transistor stack while masking the nanosheet sensor stack to form dielectric spacer layers on peripheral sides of the nanosheet transistor stack which replace peripheral portions of the silicon germanium layers in the nanosheet transistor stack and leave remnant silicon germanium layers in the nanosheet transistor stack;
    forming doped epitaxial semiconductor regions adjacent to the nanosheet transistor stack and a nanosheet sensor stack;
    selectively processing the nanosheet transistor stack while masking the nanosheet sensor stack to form gate electrodes which replace the remnant silicon germanium layers in the nanosheet transistor stack;
    selectively processing the nanosheet sensor stack while masking the nanosheet transistor stack to form silicon cantilever electrodes from the silicon layers in the nanosheet sensor stack by forming a narrow trench opening in the nanosheet sensor stack to expose the remnant silicon germanium layers on a second side in the nanosheet sensor stack and selectively removing the remnant silicon germanium layers in the nanosheet sensor stack; and
    depositing one or more dielectric layers over the nanosheet transistor stack and a nanosheet sensor stack to seal the top of the narrow trench opening.

6. The method of claim 5, where providing the stack of alternating silicon and silicon germanium layers comprises epitaxially growing alternating layers of silicon and silicon germanium on the substrate.

7. The method of claim 5, where selectively processing the nanosheet sensor stack comprises:
    partially recessing silicon germanium layers from the first side of the nanosheet sensor stack to form recess cavities in the nanosheet sensor stack; and
    filling the recess cavities with dielectric material to form the one or more dielectric layers on the first side of the nanosheet sensor stack.

8. The method of claim 7, where filling the recess cavities with dielectric material comprises depositing an oxide layer on at least the first side of the nanosheet sensor stack using a thin film technology.

9. The method of claim 5, where selectively processing the nanosheet transistor stack comprises:
    partially recessing silicon germanium layers to form recess cavities adjacent to remnant silicon germanium layers in the nanosheet transistor stack; and
    filling the recess cavities with one or more dielectric layers to form dielectric spacers on peripheral sides of the nanosheet transistor stack.

10. The method of claim 9, where filling the recess cavities comprises:
    depositing a nitride layer on at least the nanosheet transistor stack; and
    etching the nitride layer to form the nitride spacers on peripheral sides of the remnant silicon germanium layers in the nanosheet transistor stack.

11. The method of claim 5, where selectively processing the nanosheet sensor stack while masking the nanosheet transistor stack to form silicon cantilever electrodes comprises:
    selectively etching portions of the nanosheet sensor stack to form the narrow trench opening in the nanosheet sensor stack which exposes the remnant silicon germanium layers on the second side in the nanosheet sensor stack; and selectively removing the remnant silicon germanium layers from the second side of the nanosheet sensor stack, where the narrow trench opening is positioned between the silicon fixed electrodes on the first side of the nanosheet sensor stack and the silicon cantilever electrodes on the second side of the nanosheet sensor stack.

12. The method of claim 5, where depositing one or more dielectric layers comprises depositing an interlayer dielectric oxide material having poor step coverage to seal the top of the narrow trench opening without filling the remainder of the narrow trench opening.

13. A method for forming a semiconductor device comprising:
  providing a stack of alternating silicon and silicon germanium layers on a substrate;
  selectively etching the stack of alternating silicon and silicon germanium layers to form a nanosheet transistor stack and a nanosheet sensor stack on the substrate;
  processing the nanosheet sensor stack by performing nanosheet sensor stack processing steps to:
    form silicon fixed electrodes from the silicon layers in the nanosheet sensor stack by forming one or more dielectric layers in the nanosheet sensor stack which replace a portion of the silicon germanium layers in the nanosheet sensor stack and leave remnant silicon germanium layers in the nanosheet sensor stack, and
    form silicon cantilever electrodes from the silicon layers in the nanosheet sensor stack by selectively removing the remnant silicon germanium layers in the nanosheet sensor stack; and
  processing the nanosheet transistor by performing nanosheet transistor stack processing steps to:
    form dielectric spacer layers on peripheral sides of the nanosheet transistor stack which replace peripheral portions of the silicon germanium layers in the nanosheet transistor stack and leave remnant silicon germanium layers in the nanosheet transistor stack, and
    form gate electrodes which replace the remnant silicon germanium layers in the nanosheet transistor stack.

14. The method of claim 13, where processing the nanosheet sensor stack occurs before processing the nanosheet transistor stack.

15. The method of claim 13, where processing the nanosheet transistor stack occurs before processing the nanosheet sensor stack.

16. The method of claim 13, where performing nanosheet sensor stack processing steps to form silicon fixed electrodes comprises:
  partially recessing silicon germanium layers from the first side of the nanosheet sensor stack to form recess cavities in the nanosheet sensor stack; and
  filling the recess cavities with dielectric material to form the one or more dielectric layers on the first side of the nanosheet sensor stack.

17. The method of claim 16, where filling the recess cavities with dielectric material comprises depositing an oxide layer on at least the first side of the nanosheet sensor stack using a thin film technology comprising chemical vapor deposition, plasma enhanced chemical vapor deposition, molecular beam epitaxy, sputtering, and/or atomic layer deposition.

18. The method of claim 13, where performing nanosheet transistor stack processing steps to form dielectric spacer layers comprises:
  partially recessing silicon germanium layers from peripheral sides of the nanosheet transistor stack to form recess cavities adjacent to remnant silicon germanium layers in the nanosheet transistor stack; and
  filling the recess cavities with one or more dielectric layers to form dielectric spacers on peripheral sides of the nanosheet transistor stack.

19. The method of claim 18, where filling the recess cavities comprises:
  depositing a nitride layer on at least the nanosheet transistor stack using a thin film technology comprising chemical vapor deposition, plasma enhanced chemical vapor deposition, molecular beam epitaxy, sputtering, and/or atomic layer deposition; and
  etching the nitride layer to form the nitride spacers on peripheral sides of the remnant silicon germanium layers in the nanosheet transistor stack.

20. The method of claim 13, where performing nanosheet sensor stack processing steps to form silicon cantilever electrodes comprises:
  selectively etching portions of the nanosheet sensor stack exposed by the mask opening to form the narrow trench opening in the nanosheet sensor stack which exposes the remnant silicon germanium layers on the second side in the nanosheet sensor stack; and
  selectively removing the remnant silicon germanium layers from the second side of the nanosheet sensor stack, where the mask opening is positioned over the nanosheet sensor stack to form the narrow trench opening between the silicon fixed electrodes on the first side of the nanosheet sensor stack and the silicon cantilever electrodes on the second side of the nanosheet sensor stack.

21. The method of claim 13, where depositing one or more dielectric layers comprises depositing an interlayer dielectric oxide material having poor step coverage to seal the top of the narrow trench opening without filling the remainder of the narrow trench opening.

* * * * *